(12) United States Patent
Nagai et al.

(10) Patent No.: US 8,952,680 B2
(45) Date of Patent: Feb. 10, 2015

(54) MAGNETIC SENSOR AND CURRENT MEASURING APPARATUS

(75) Inventors: Akihiro Nagai, Ueda (JP); Yoshinori Furuhata, Ueda (JP); Satoshi Imaizumi, Ueda (JP)

(73) Assignee: Hioki Denki Kabushiki Kaisha, Nagano (JP)

( * ) Notice: Subject to any disclaimer, the term of this patent is extended or adjusted under 35 U.S.C. 154(b) by 352 days.

(21) Appl. No.: 13/426,803

(22) Filed: Mar. 22, 2012

(65) Prior Publication Data

US 2013/0063140 A1  Mar. 14, 2013

(30) Foreign Application Priority Data

Sep. 9, 2011 (JP) .................................. 2011-196647
Nov. 25, 2011 (JP) .................................. 2011-257829

(51) Int. Cl.
*G01R 15/18* (2006.01)
*G01R 1/22* (2006.01)

(52) U.S. Cl.
CPC ............... *G01R 15/186* (2013.01); *G01R 1/22* (2013.01)
USPC ................... 324/127; 324/117 H; 324/117 R; 336/175; 336/176; 336/87

(58) Field of Classification Search
USPC .......................................... 324/117 H, 117 R
See application file for complete search history.

(56) References Cited

U.S. PATENT DOCUMENTS

| | | | | |
|---|---|---|---|---|
| 2,476,121 A | * | 7/1949 | Smith, Jr. ......................... | 336/90 |
| 3,253,215 A | * | 5/1966 | Moakler et al. ............... | 324/529 |
| 4,048,605 A | * | 9/1977 | McCollum .................... | 336/176 |
| 4,283,677 A | * | 8/1981 | Niwa ............................ | 324/127 |

FOREIGN PATENT DOCUMENTS

JP  11-295346  10/1999

* cited by examiner

*Primary Examiner* — Richard Isla Rodas
(74) *Attorney, Agent, or Firm* — Greenblum & Bernstein, P.L.C.

(57) ABSTRACT

A magnetic sensor includes two sensor units with curved cores including meshing portions at front and base ends thereof and constructs a ring when the meshing portions mesh together. The meshing portions include main meshing portions that entirely overlap in a completely meshed state where the meshing portions overlap to the greatest extent. Auxiliary meshing portions that protrude inside and/or outside the ring are provided on the main meshing portions at the front and/or the base ends. In the completely meshed state, the auxiliary meshing portions do not overlap the main meshing portions or auxiliary meshing portions of the other core. In a non-completely meshed state where the main meshing portions partially do not overlap, the auxiliary meshing portions at least partially overlap the main meshing portions and/or auxiliary meshing portions of the other core.

24 Claims, 18 Drawing Sheets

F I G. 1 2

|  |  | 0° STATE | 0.5° STATE | 1° STATE |
|---|---|---|---|---|
| NO AUXILIARY MESHING PORTIONS | MESHING AREA M1 | 100 | 83.6 | 67.5 |
|  |  |  | REDUCTION 16.4% | REDUCTION 32.5% |
|  | MESHING AREA M2 | 100 | 94.3 | 88.5 |
|  |  |  | REDUCTION 5.7% | REDUCTION 11.5% |
| WITH AUXILIARY MESHING PORTIONS | MESHING AREA M3 | 100 | 84.5 | 68.4 |
|  |  |  | REDUCTION 15.5% | REDUCTION 31.6% |
|  | MESHING AREA M4 | 100 | 94.5 | 88.7 |
|  |  |  | REDUCTION 5.5% | REDUCTION 11.3% |

F I G. 1 6
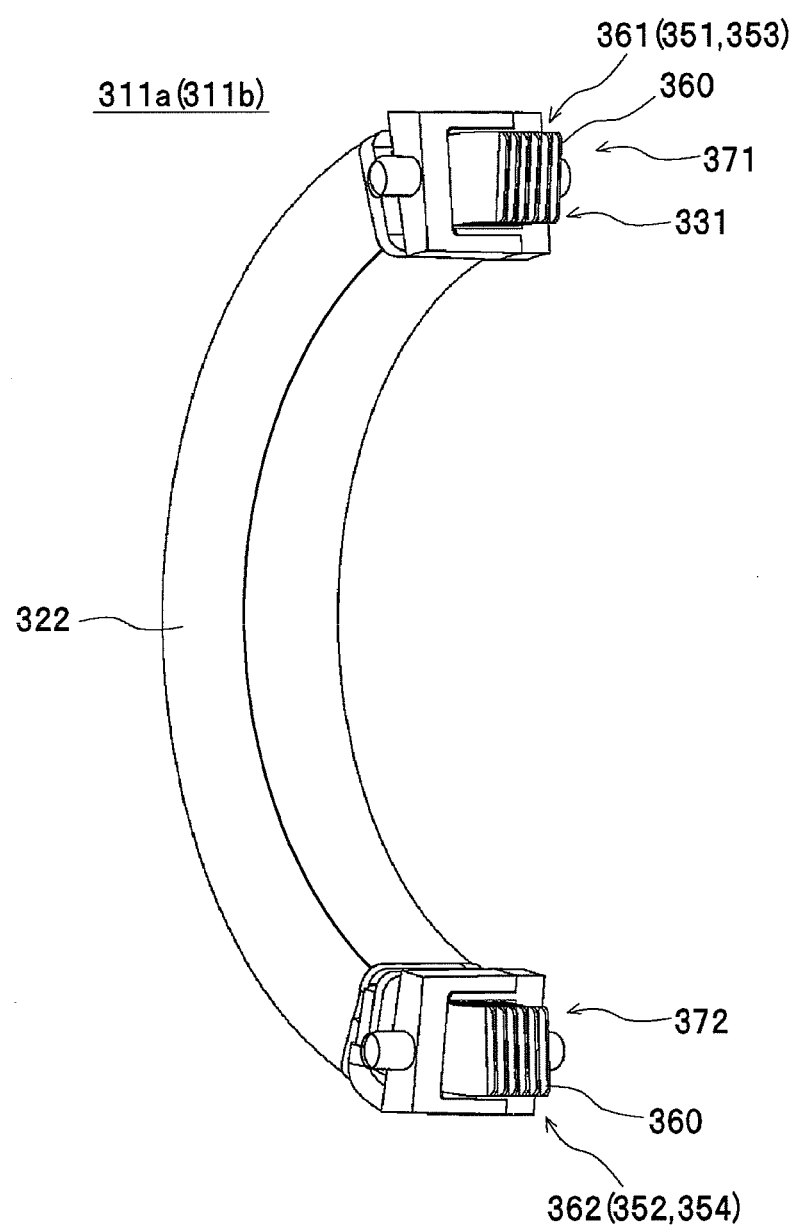

MAGNETIC SENSOR AND CURRENT MEASURING APPARATUS

FIELD OF THE INVENTION

The present invention relates to a magnetic sensor that detects magnetism and a current measuring apparatus equipped with such magnetic sensor.

DESCRIPTION OF THE RELATED ART

As one example of a magnetic sensor of this type, a core sensor disclosed by the present applicant in Japanese Laid-Open Patent Publication No. H11-295346 is known. This core sensor is constructed so as to include a pair of core sensor portions, each of which has a winding, which is produced by winding wire via a bobbin onto a magnetic core formed by laminating magnetic steel plates in substantially a circular arc shape, covered with an insulating member. The magnetic cores of the core sensor portions each have a base end meshing portion and a front end meshing portion and are constructed so that during use, the base end meshing portions of the respective magnetic cores mesh together and the front end meshing portions of the respective magnetic cores mesh together.

SUMMARY OF THE INVENTION

However, by investigating the core sensor described above, the present inventors discovered the following issue to be solved with the core sensor described above. That is, during use of the core sensor, the meshing portions (base end meshing portions and front end meshing portions) of the respective magnetic cores mesh together. Also, a core sensor of this type is constructed so that the core sensor portions are rotatable about pivots at the base end portions thereof and are energized by a spring in the direction in which the respective meshing portions become meshed together. With this construction, as one example, there are cases where the meshing portions do not completely mesh together due to a fall in the energizing force of the spring caused by deterioration over time. In this case, in a non-completely meshed state where the meshing portions do not completely mesh together, since the area where the meshing portions mesh together is reduced compared to a completely meshed state where the meshing portions completely mesh together, there is a drop in the detection sensitivity of the core sensor, resulting in the issue that the measurement precision may fall. Here, as one means of solving this issue, it would be conceivable to use a construction including a spring with a large energizing force. However, with such construction, a large force would be required when separating the meshing portions of the two magnetic cores (i.e., when opening the two magnetic cores), which would make the core sensor more difficult to operate. For this reason, it is desirable to develop a construction that is capable of solving the issue described above without using such a means.

The present invention was conceived to solve the issue described above and it is a principal object of the present invention to provide a magnetic sensor and a current measuring apparatus capable of suppressing a drop in detection sensitivity.

To achieve the stated object, a magnetic sensor according to the present invention comprises: a pair of sensor units that include substantially arc-shaped magnetic cores formed by laminating a plurality of magnetic plates which are provided with meshing portions at front end portions and base end portions thereof, the sensor units being constructed so as to be rotatable about pivots at base end portion sides thereof, wherein in a state where the meshing portions of the magnetic plates of the pair of sensor units are meshed together to construct a ring-shaped body, the magnetic sensor detects magnetism of a detected body surrounded by the ring-shaped body, the meshing portions include main meshing portions whose entire meshing regions overlap one another in a completely meshed state where the respective meshing portions overlap one another to a greatest extent, auxiliary meshing portions that protrude at least one of inside and outside the ring-shaped body are provided on the main meshing portions of at least one of the meshing portions provided on the front end portions and the meshing portions provided on the base end portions, and the auxiliary meshing portions are formed so that in the completely meshed state, entire meshing regions of the auxiliary meshing portions do not overlap the main meshing portions of the other magnetic plates being meshed and the meshing regions of the auxiliary meshing portions of the other magnetic plates and so that in a non-completely meshed state where the meshing portions mesh together but without parts of the meshing regions of the main meshing portions overlapping, part or all of the meshing regions of the auxiliary meshing portions overlap meshing regions of one of the main meshing portions of the other magnetic plates and the auxiliary meshing portions of the other magnetic plates.

Also, a current measuring apparatus according to the present invention may comprise: the magnetic sensor described above; and a measuring unit measuring a current flowing in the detected body based on a strength of the magnetism detected by the magnetic sensor.

In this way, according to the magnetic sensor and the current measuring apparatus, by providing the auxiliary meshing portions that protrude at least one of inside and outside the ring-shaped body on at least one of the meshing portion provided at the front end portion of the magnetic plates and the meshing portion provided at the base end portion, even if there is a reduction in the meshing area (the overlapping area) of the main meshing portions in a non-completely meshed state where the meshing portions mesh together but without parts of the meshing regions of the main meshing portions overlapping due to a drop in the energizing force of the spring or the like, it is possible to reliably supplement the reduction in the meshing area of the main meshing portions due to part or all of the meshing regions of the auxiliary meshing portions overlapping the meshing region of one of the main meshing portions and the auxiliary meshing portions of the other magnetic plates being meshed. For this reason, according to the magnetic sensor and the current measuring apparatus, even in the non-completely meshed state, it is possible to sufficiently suppress the drop in detection sensitivity of the magnetic sensor for magnetism, and as a result, it is possible to sufficiently improve the measurement precision.

Also, in the magnetic sensor according to the present invention, the pair of sensor units may be constructed so as to each include a coil portion formed by winding a lead wire around the magnetic core of the sensor unit.

By using such construction, it is possible to measure a weak alternating current flowing in the detected body using the magnetic sensor and to sufficiently improve the measurement precision when measuring such weak alternating current.

Also, in the magnetic sensor according to the present invention, at least one out of the pair of sensor units may include a magnetism detecting element that detects magnetic flux induced in the ring-shaped body.

By using such construction, it is possible to measure both the direct current and alternating current flowing in the detected body in a contactless manner using the magnetic sensor, and to sufficiently improve the measurement precision when measuring the currents.

Also, in the magnetic sensor according to the present invention, the auxiliary meshing portions may be formed on the main meshing portions of both the meshing portions provided at the front end portions and the meshing portions provided at the base end portions.

By using such construction, even if the meshing areas of both the main meshing portions at the front end portions and the main meshing portions at the base end portions are reduced in a non-completely meshed state, it is possible to supplement the reductions in both meshing areas. For this reason, according to the magnetic sensor and the current measuring apparatus, it is possible to further suppress the drop in the detection sensitivity of the magnetic sensor for magnetism, and as a result it is possible to further improve the measurement sensitivity.

Also, in the magnetic sensor according to the present invention, the auxiliary meshing portions may be formed so as to protrude both inside and outside the ring-shaped body.

By using such construction, it is possible in a non-completely meshed state to increase the area (meshing area) that overlaps with the meshing regions of any of the main meshing portions and the auxiliary meshing portions of the other magnetic plates. This means that according to the magnetic sensor and the current measuring apparatus, since it is possible to supplement the reduction in the meshing area of the main meshing portions more reliably, it is possible to suppress the drop in detection sensitivity of the magnetic sensor for magnetism more significantly.

It should be noted that the disclosure of the present invention relates to a content of Japanese Patent Application 2011-196647 that was filed on 9 Sep. 2011 and Japanese Patent Application 2011-257829 that was filed on 25 Nov. 2011, and the entire content of which is herein incorporated by reference.

BRIEF DESCRIPTION OF THE DRAWINGS

These and other objects and features of the present invention will be explained in more detail below with reference to the attached drawings, wherein:

FIG. 12 is a measurement results table showing measurement results for meshing area;

FIG. 16 is a perspective view showing the construction of a magnetic core and a cover of the sensor according to the other embodiment;

DESCRIPTION OF THE PREFERRED EMBODIMENTS

Preferred embodiments of a magnetic sensor and a current measuring apparatus according to the present invention will now be described with reference to the attached drawings.

First, the construction of a current measuring apparatus 1 will be described with reference to the drawings. The current measuring apparatus 1 shown in FIG. 1 is a clamp-type current measuring apparatus that is capable for example of measuring a current I (alternating current: see FIG. 2) flowing in a wire 200 as a detected body in a non-contact manner, and includes a magnetic sensor 2 and a main unit 3.

Figure 1:
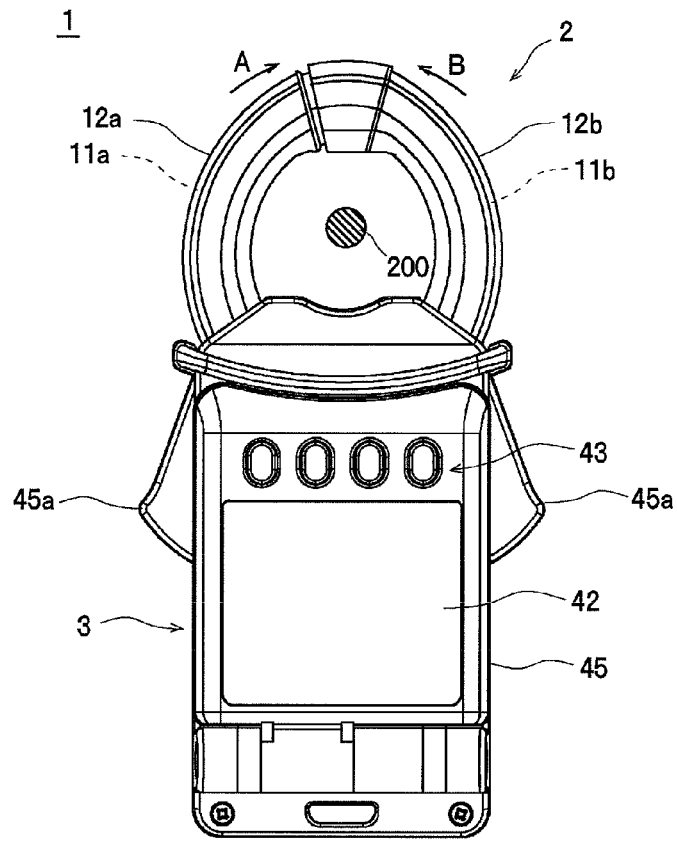
FIG. 1 is a front view of a current measuring apparatus.

The magnetic sensor 2 is one example of a "magnetic sensor" for the present invention and as shown in FIG. 1, includes sensors ("sensor units") 11a, 11b (hereinafter referred to as "sensors 11" when no distinction is required) and cases 12a, 12b (hereinafter referred to as "cases 12" when no distinction is required), and is capable of detecting magnetism produced when the current I (alternating current) flows in the wire 200 as the detected body.

Figure 4:
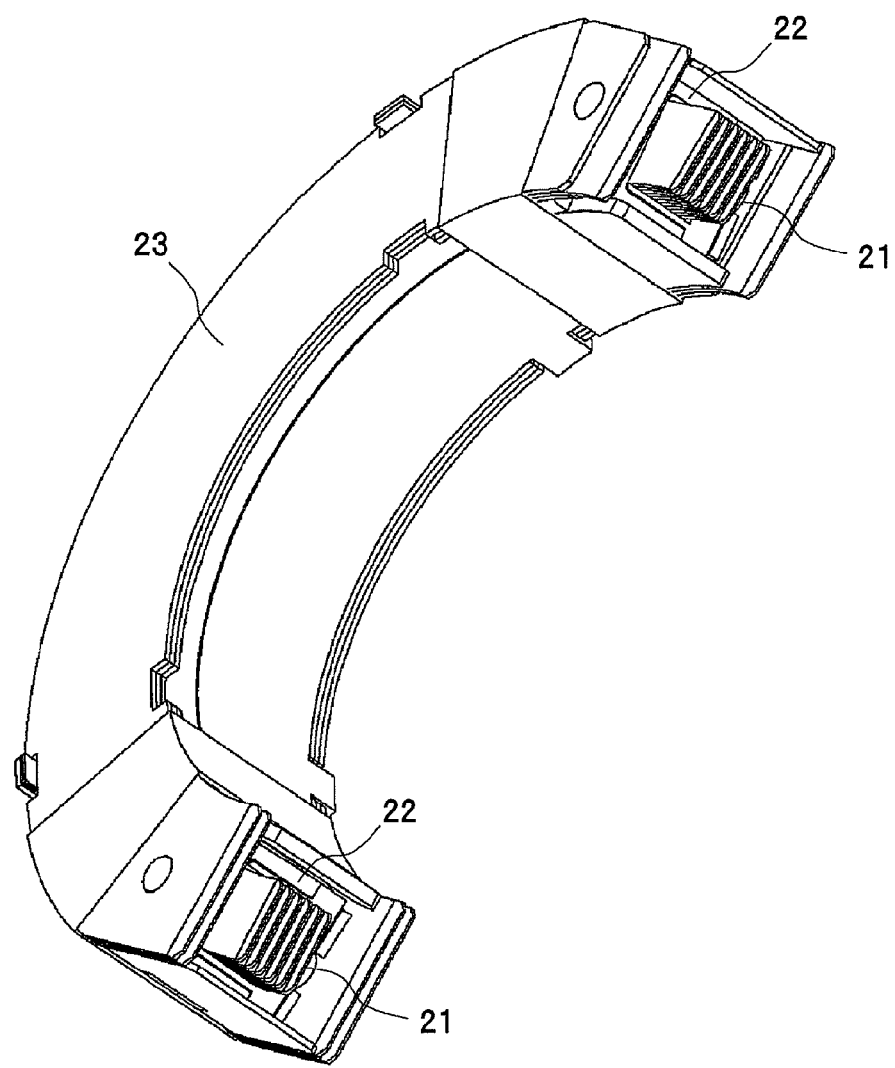
FIG. 4 is a perspective view of a sensor.
Figure 5:
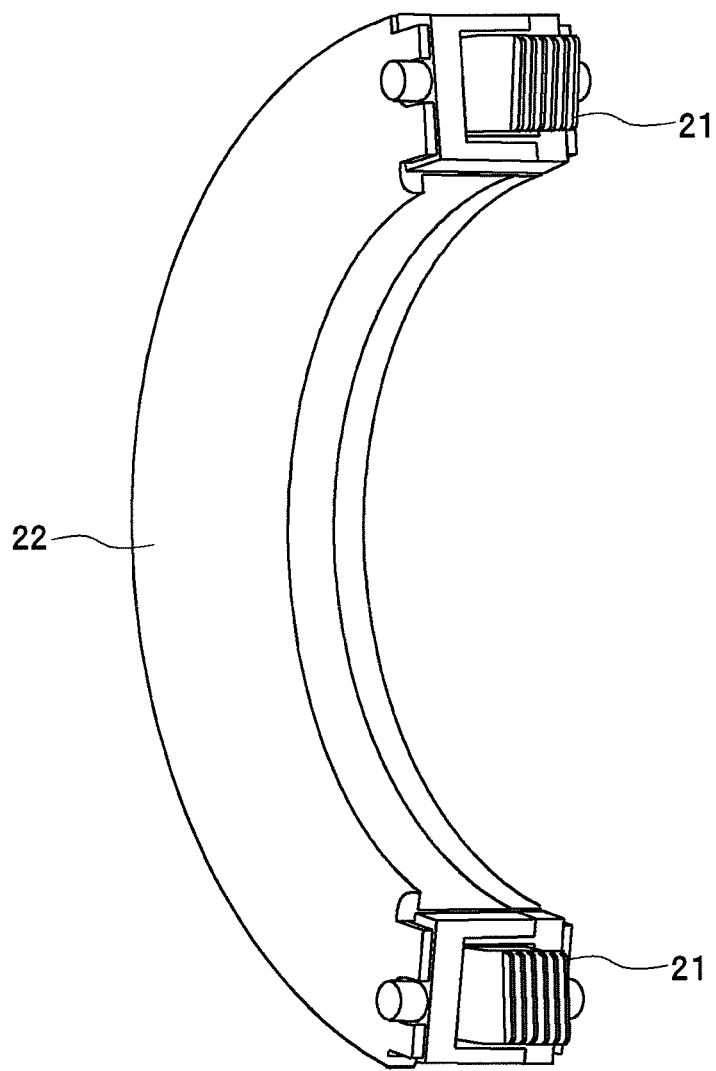
FIG. 5 is a perspective view of a state where a coil portion is covered with a coil cover.

As shown in FIGS. 4 and 5, the sensors 11a, 11b are constructed so as to each include a coil portion 21, a coil cover 22, and a shield portion 23. The coil portion 21 of the sensor 11a will be referred to hereinafter as the "coil portion 21a" and the coil portion 21 of the sensor 11b will be referred to hereinafter as the "coil portion 21b". Also, since the sensors 11a, 11b have the same construction, such common parts will be described only for the sensor 11a and description of the sensor 11b is omitted.

Figure 6:
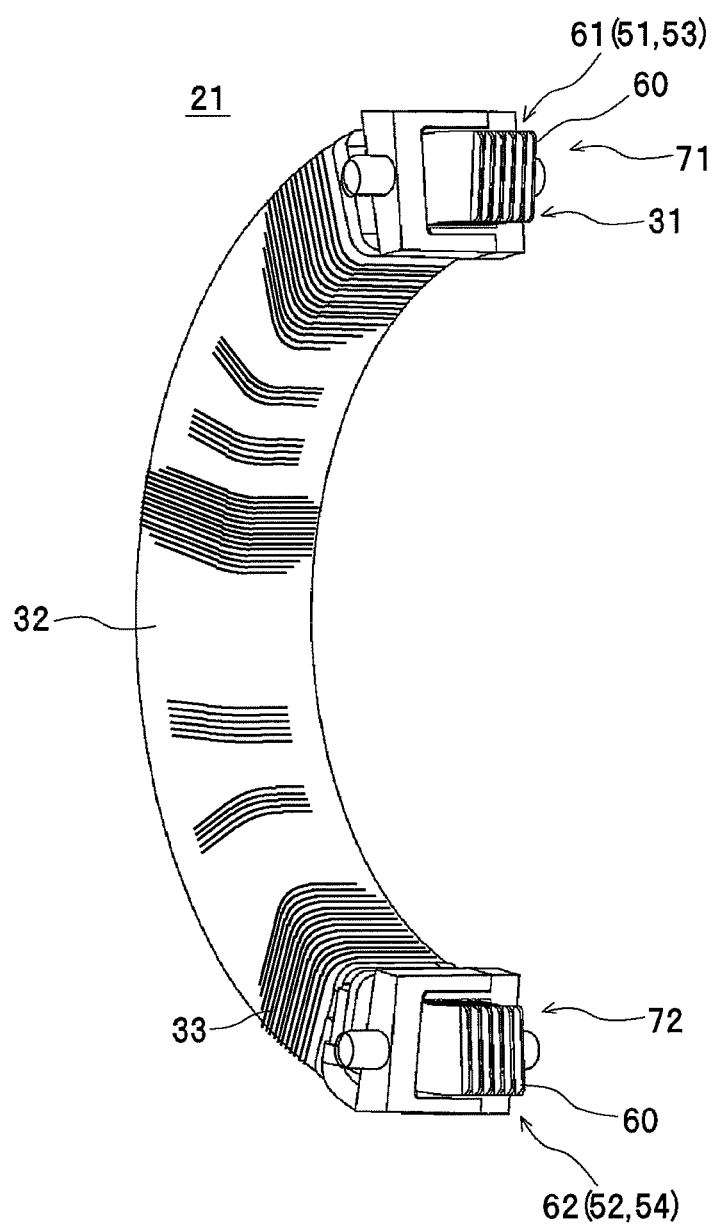
FIG. 6 is a perspective view of a coil portion.

As shown in FIG. 6, the coil portion 21 includes a magnetic core 31, a bobbin 32 that covers a part aside from a front end portion and a base end portion of the magnetic core 31, and a lead wire 33 wound around the bobbin 32, and is substantially arc-shaped (substantially circular arc-shaped) when viewed from above. Note that the magnetic core 31 of the sensor 11a will be referred to hereinafter as the "magnetic core 31a" and the magnetic core 31 of the sensor 11b will be referred to hereinafter as the "magnetic core 31b".

Figure 7:
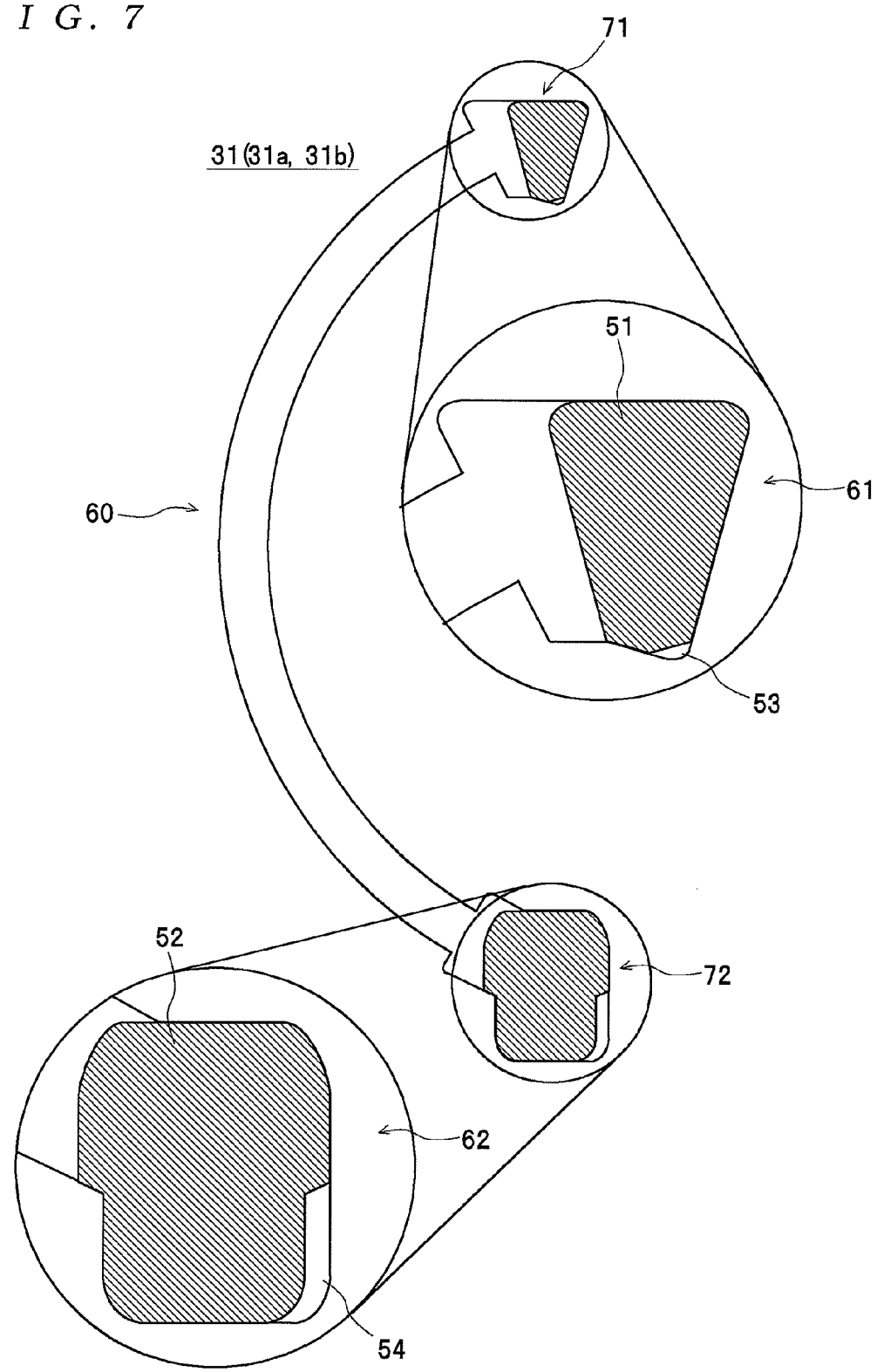
FIG. 7 is a plan view showing the construction of a magnetic core.

As shown in FIG. 6, the magnetic core 31 is formed by laminating a plurality of magnetic plates (as one example, metal plates) 60. In this case, as shown in FIG. 7, the magnetic plates 60 have a meshing portion 61 provided at a front end portion 71 thereof and a meshing portion 62 provided at a base end portion 72 thereof and are substantially arc-shaped (substantially circular arc-shaped) when viewed from above. Also, by having spacers, which are formed of magnetic plates of the same shape as the magnetic plates 60 with the meshing portions 61, 62 removed, sandwiched between the magnetic plates 60, the magnetic cores 31 are formed as shown in FIG. 6 with gaps formed between the respective meshing portions 61 and between the respective meshing portions 62. Note that the meshing portions 61, 62 of the magnetic core 31a will be referred to hereinafter as the "meshing portions 61a, 62a" and the meshing portions 61, 62 of the magnetic core 31b will be referred to hereinafter as the "meshing portions 61b, 62b".

Figure 8:
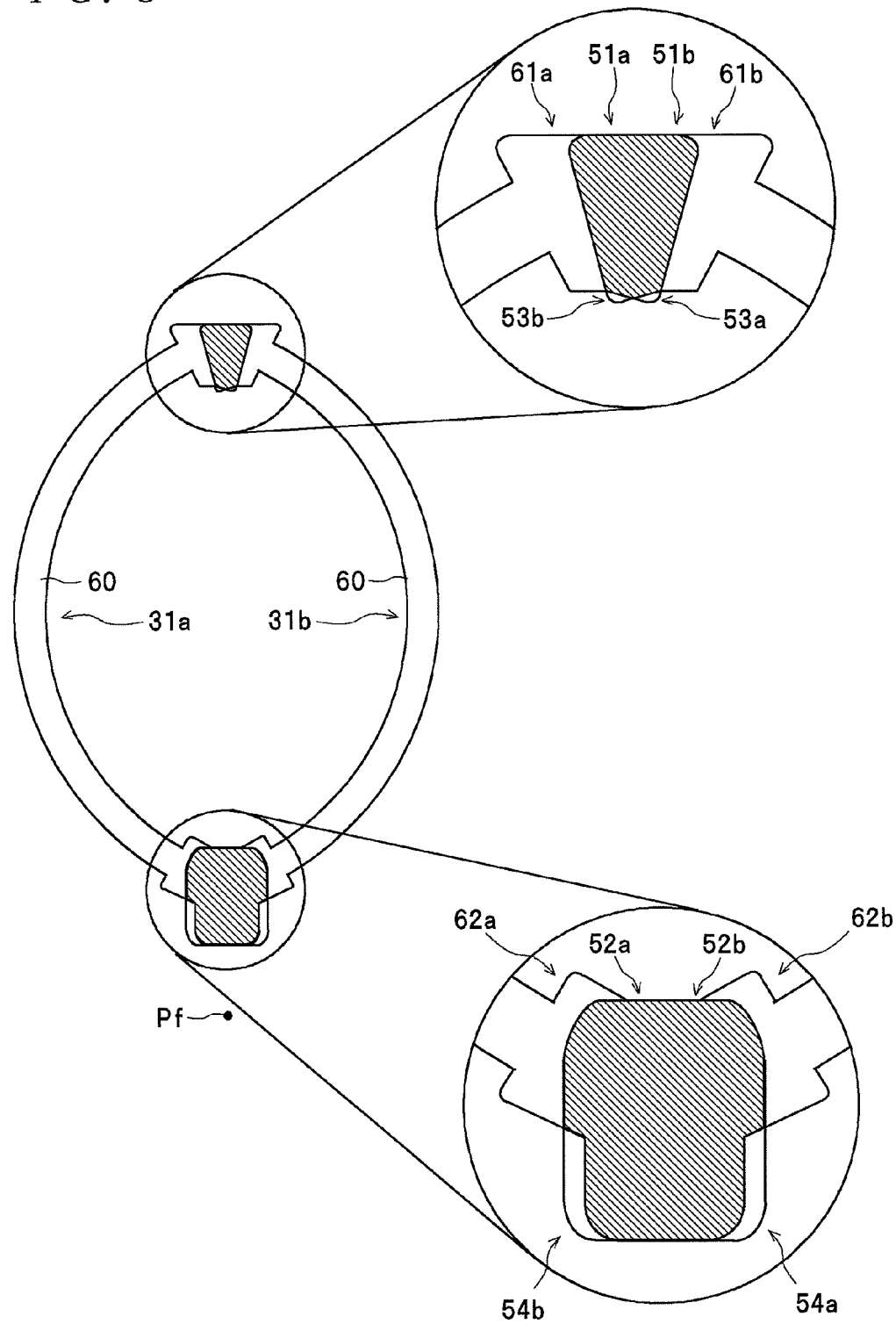
FIG. 8 is a first diagram useful in explaining a meshing state of main meshing portions and auxiliary meshing portions.

With the current measuring apparatus 1, during use, as shown in FIG. 8, the meshing portion 61a of the magnetic core 31a and the meshing portion 61b of the magnetic core 31b mesh together and the meshing portion 62a of the magnetic core 31a and the meshing portion 62b of the magnetic core 31b mesh together to construct a ring-shaped body. Also, the magnetism of a detected body surrounded by such ring-shaped body is detected by the sensors 11a, 11b (the magnetic sensor 2) and a detection signal Sd is outputted.

As shown in FIG. 7, the meshing portion 61 includes a main meshing portion 51 and the meshing portion 62 includes a main meshing portion 52. Note that the main meshing portions 51, 52 of the magnetic core 31a will be referred to hereinafter as the "main meshing portions 51a, 52a" and the main meshing portions 51, 52 of the magnetic core 31b will be referred to hereinafter as the "main meshing portions 51b, 52b".

In this case, as shown in FIG. 8, in a state where the front end portion of the main meshing portion 51a is positioned on the base end side of the main meshing portion 51b and the front end portion of the main meshing portion 51b is positioned on the base end side of the main meshing portion 51a and where the front end portion of the main meshing portion 52a is positioned on the base end side of the main meshing portion 52b and the front end portion of the main meshing portion 52b is positioned on the base end side of the main meshing portion 52a, the entire meshing regions of the main meshing portions 51a, 51b (i.e., the region that is obliquely shaded in FIG. 8) mesh together and the entire meshing regions of the main meshing portions 52a, 52b (i.e., the region that is obliquely shaded in FIG. 8) also mesh together. Putting this another way, in this state, the entire meshing regions of the main meshing portions 51a, 51b overlap one another when viewed from above and the entire meshing regions of the main meshing portions 52a, 52b overlap one another when viewed from above (hereinafter, this is simply referred to as "overlapping"). That is, in this state, the main meshing portions 51a, 51b overlap one another and the main meshing portions 52a, 52b overlap one another to the greatest extent (hereinafter, this state is referred to as the "completely meshed state").

Also, as shown in FIGS. 7 and 8, an auxiliary meshing portion 53 that protrudes inside the ring-shaped body described above is formed on the main meshing portion 51 and an auxiliary meshing portion 54 that protrudes outside the ring-shaped body is formed on the main meshing portion 52. Note that the auxiliary meshing portions 53, 54 provided on the magnetic core 31a will be referred to hereinafter as the "auxiliary meshing portions 53a, 54a" and the auxiliary meshing portions 53, 54 provided on the magnetic core 31b will be referred to hereinafter as the "auxiliary meshing portions 53b, 54b".

In this case, as shown in FIG. 8, in the completely meshed state described above, the entire meshing region of the auxiliary meshing portion 53a does not overlap the meshing region of the main meshing portion 51b (the main meshing portion 51 of the other magnetic plates 60) or the auxiliary meshing portion 53b (the auxiliary meshing portion 53 of the other magnetic plates 60). On the other hand, as shown in FIGS. 9 and 10, in a non-completely meshed state where the main meshing portions 51a, 51b and the main meshing portions 52a, 52b mesh but without parts of the meshing regions of the main meshing portions 51a, 51b and parts of the meshing regions of the main meshing portions 52a, 52b overlapping, part or all of the meshing region of the auxiliary meshing portion 53a (an example of "part" is shown in FIG. 9 and an example of "all" is shown in FIG. 10) overlaps the meshing region of one of the main meshing portion 51b and the auxiliary meshing portion 53b.

Figure 9:
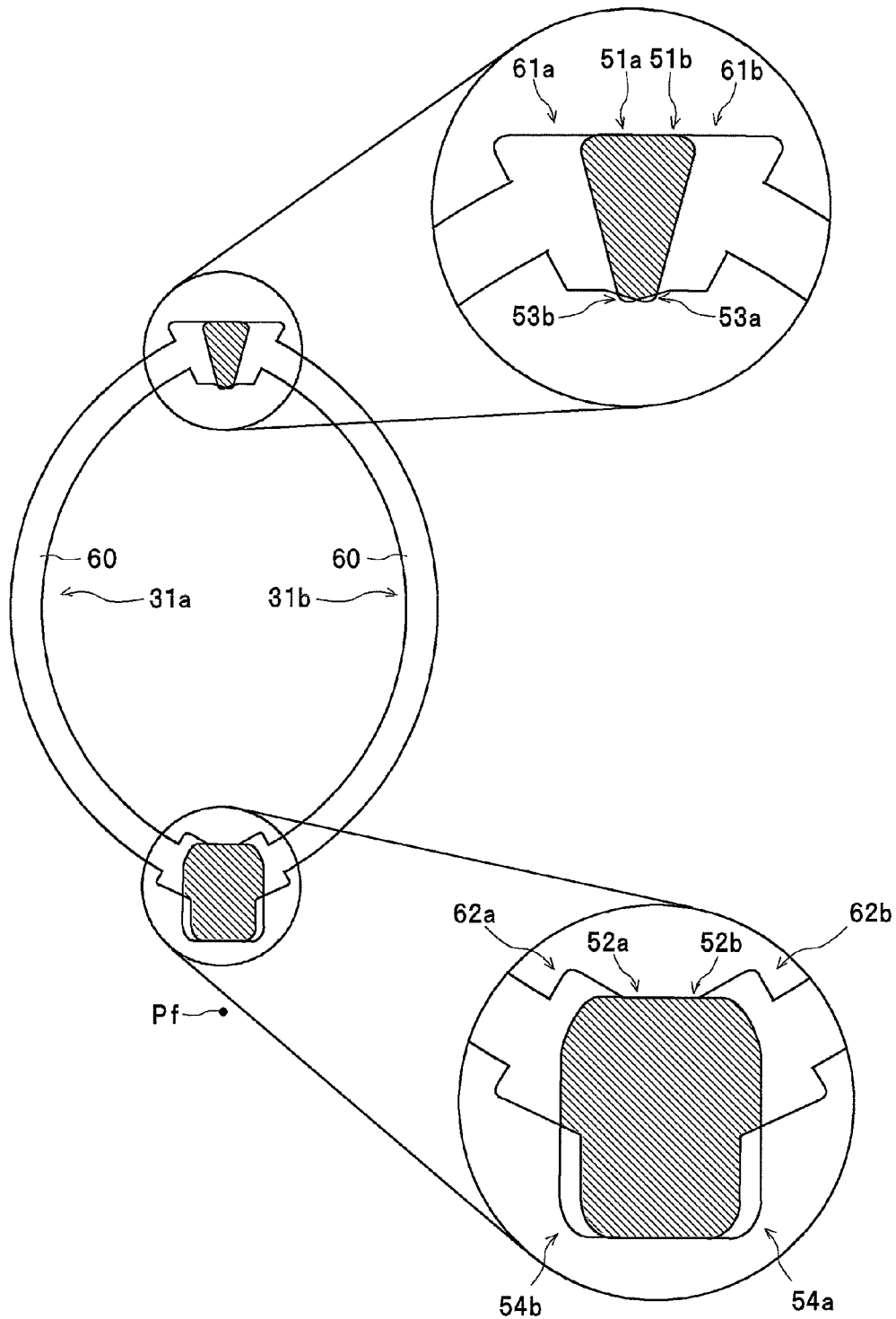
FIG. 9 is a second diagram useful in explaining a meshing state of the main meshing portions and the auxiliary meshing portions.
Figure 10:
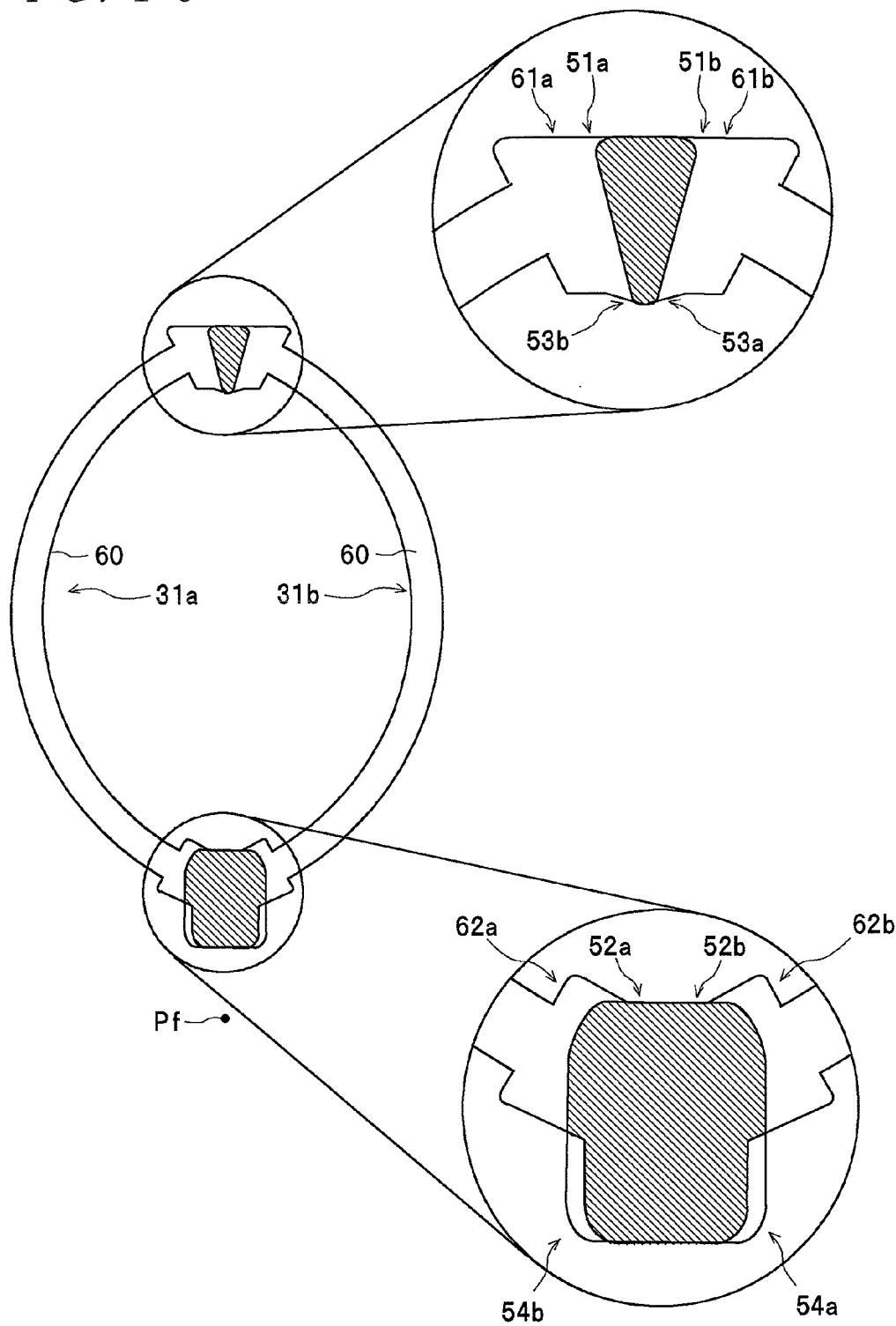
FIG. 10 is a third diagram useful in explaining a meshing state of the main meshing portions and the auxiliary meshing portions.

Also, as shown in FIG. 8, in the completely meshed state, an auxiliary meshing portion 54a does not overlap the meshing region of a main meshing portion 52b (the main meshing portion 52 of the other magnetic plates 60) or the auxiliary meshing portion 54b (the auxiliary meshing portion 54 of the other magnetic plates 60), and as shown in FIGS. 9 and 10, in a non-completely meshed state, part (one example of part or all) of the meshing region of the auxiliary meshing portion 54a overlaps the meshing region of one of the main meshing portion 52b and the auxiliary meshing portion 54b.

In the same way, as shown in FIG. 8, in the completely meshed state, an auxiliary meshing portion 53b does not overlap the meshing region of a main meshing portion 51a (the main meshing portion 51 of the other magnetic plates 60) or the auxiliary meshing portion 53a (the auxiliary meshing portion 53 of the other magnetic plates 60), and as shown in FIGS. 9 and 10, in a non-completely meshed state, part or all of the meshing region of the auxiliary meshing portion 53b (an example of "part" is shown in FIG. 9 and an example of "all" is shown in FIG. 10) overlaps the meshing region of one of the main meshing portion 51a and the auxiliary meshing portion 53a. Also, as shown in FIG. 8, in the completely meshed state, an auxiliary meshing portion 54b does not overlap the meshing region of a main meshing portion 52a (the main meshing portion 52 of the other magnetic plates 60) or the auxiliary meshing portion 54a (the auxiliary meshing portion 54 of the other magnetic plates 60), and as shown in FIGS. 9 and 10, in a non-completely meshed state, part (one example of part or all) of the meshing region of the auxiliary meshing portion 54b overlaps the meshing region of one of the main meshing portion 52a and the auxiliary meshing portion 54a.

As shown in FIG. 5, the coil cover 22 is disposed so as to cover a part of the coil portion 21 where the lead wire 33 has been wound (see FIG. 6). The shield portion 23 functions so as to prevent the effects of disturbances when measuring current using the current measuring apparatus 1 equipped with the magnetic sensor 2, and as shown in FIG. 4 is disposed so as to surround the coil cover 22 disposed on the coil portion 21.

The cases 12a, 12b are constructed so as to be capable of housing the sensors 11a, 11b. Here, the sensors 11a, 11b are respectively housed in the cases 12a, 12b so that one of the sensors 11a, 11b is positioned so as to be shallower or deeper in a thickness direction (a direction that passes perpendicularly through the plane of FIG. 1) than the other of the sensors 11a, 11b by a length corresponding to the thickness of one magnetic plate 60, and by using this construction, the meshing portions 61 are capable of meshing (overlapping) together and the meshing portions 62 are capable of meshing (overlapping) together.

As shown in FIG. 1, base end portions of the cases 12a, 12b are attached to the case 45 of the main unit 3 so as to be rotatable about a support shaft (not shown) that is fixed to a pivot Pf (see FIG. 8) of the case 45. Also, the cases 12a, 12b are energized by the energizing force of a spring (not shown)

in directions (the directions of the arrows A, B shown in FIG. 1) where the front end portions of the sensors 11a, 11b approach one another.

Figure 2:
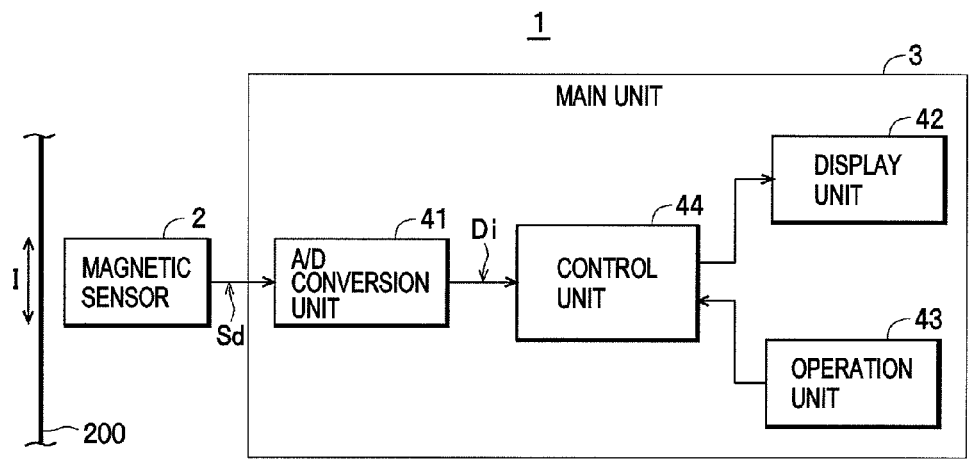
FIG. 2 is a schematic diagram showing the construction of the current measuring apparatus.

As shown in FIG. 2, the main unit 3 includes an A/D conversion unit 41, a display unit 42, an operation unit 43, a control unit 44, and the case 45 (see FIG. 1) in which or on which such component elements are enclosed or disposed. Together with the control unit 44, the A/D conversion unit 41 constructs a "measuring unit" for the present invention, subjects the detection signal Sd outputted from the magnetic sensor 2 to analog/digital conversion, and outputs current data Di. The display unit 42 is constructed of a liquid crystal panel, for example, and as shown in FIG. 1, is disposed on a front panel of the case 45. The display unit 42 displays various measurement values and the like in accordance with control by the control unit 44.

The operation unit 43 includes various switches such as a power switch and a range switching switch and as shown in FIG. 1 is disposed on the front panel of the case 45. The operation unit 43 also outputs operation signals in accordance with switch operations. The control unit 44 controls the units that construct the main unit 3 in accordance with the operation signals outputted from the operation unit 43. The control unit 44 also calculates a current value Im based on the current data Di outputted from the A/D conversion unit 41 (that is, based on the detection signal Sd outputted from the magnetic sensor 2) and has the calculated current value Im displayed on the display unit 42. Also as shown in FIG. 1, levers 45a, 45a for rotating the cases 12a, 12b are provided on the case 45.

Next, a method of measuring the current I using the current measuring apparatus 1 will be described with reference to the drawings.

Figure 3:
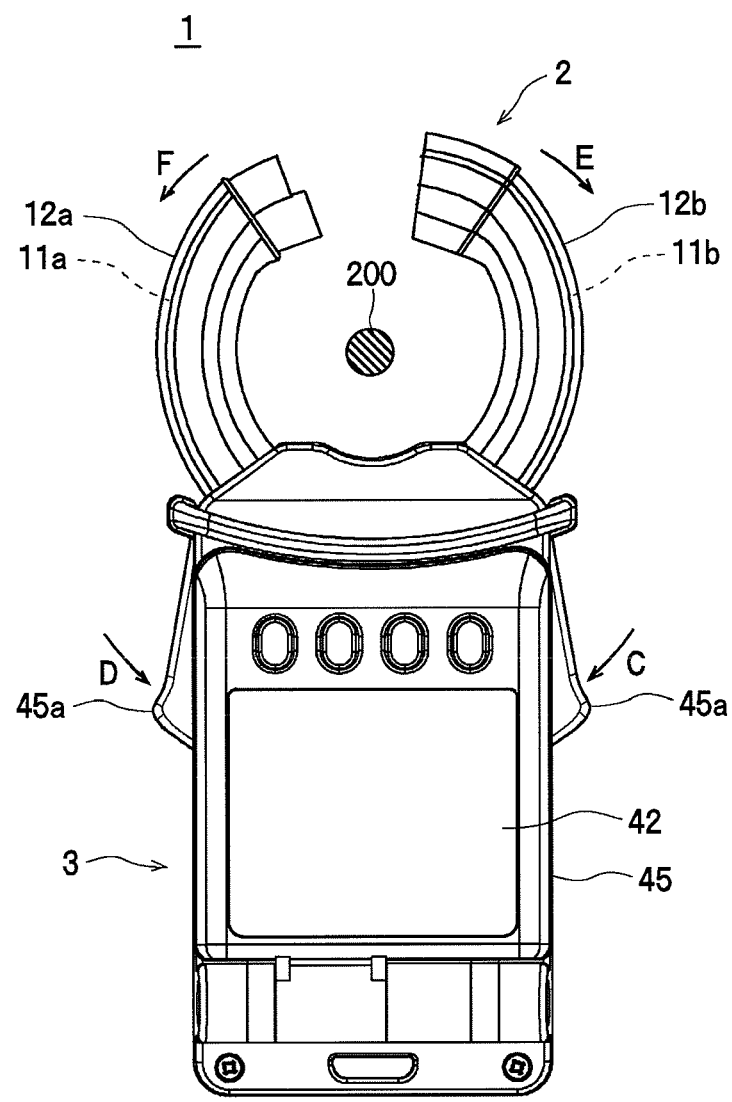
FIG. 3 is a front view of the current measuring apparatus in a state where cases have been rotated.

For example, when measuring the current value Im of the current I flowing in the wire 200 shown in FIG. 2, the operation unit 43 is operated to set the measurement range and the like. Next, by pressing the levers 45a, 45a in the directions of the arrows C, D shown in FIG. 3, the cases 12a, 12b that house the sensors 11a, 11b are rotated in the directions of the arrows E, F shown in FIG. 3. When doing so, the front end portions of the sensors 11a, 11b (the meshing portions 61a, 61b of the magnetic cores 31a, 31b of the coil portions 21a, 21b) become separated.

Next, as shown in FIG. 1, the pressing of the levers 45a, 45a is released in a state where the wire 200 is surrounded by the sensors 11a, 11b. When doing so, the sensors 11a, 11b (the cases 12a, 12b) rotate in the direction of the arrows A, B shown in FIG. 1 due to the energizing force of the spring (not shown). Also, the meshing portions 61a, 61b of the magnetic cores 31a, 31b of the coil portions 21a, 21b of the sensors 11a, 11b mesh together. The meshing portions 62a, 62b of the magnetic cores 31a, 31b also mesh together. By doing so, the wire 200 becomes surrounded by the magnetic sensor 2.

In this case, in the completely meshed state where the main meshing portions 51a, 51b of the meshing portions 61a, 61b overlap to the greatest extent and the main meshing portions 52a, 52b of the meshing portions 62a, 62b overlap to the greatest extent, as shown in FIG. 8, the entire meshing regions of the main meshing portions 51a, 51b mesh together and the entire meshing regions of the main meshing portions 52a, 52b mesh together. On the other hand, in this completely meshed state, as shown in FIG. 8, the meshing regions of the auxiliary meshing portions 53a, 53b do not mesh with the meshing region of the main meshing portion 51 or the auxiliary meshing portion 53 of the other magnetic plates 60 and the meshing regions of the auxiliary meshing portions 54a, 54b do not mesh with the meshing region of the main meshing portion 52 or the auxiliary meshing portion 54 of the other magnetic plates 60.

Next, the sensors 11a, 11b detect the magnetism produced from the wire 200 due to the current I flowing in the wire 200 and output the detection signal Sd. After this, the control unit 44 controls the A/D conversion unit 41 to carry out analog/digital conversion on the detection signal Sd and to output the current data Di. Next, the control unit 44 calculates the current value Im based on the current data Di. After this, the control unit 44 controls the display unit 42 to display the calculated current value Im.

Here, as one example, if the spring that energizes the cases 12a, 12b deteriorates and there is a drop in the energizing force, in some cases a non-completely meshed state will be produced where the meshing portions 61a, 61b do not completely mesh and the meshing portions 62a, 62b do not completely mesh. In this non-completely meshed state, as shown in FIG. 9, parts of the meshing regions of the main meshing portions 51a, 51b do not overlap and parts of the meshing regions of the main meshing portions 52a, 52b do not overlap. On the other hand, as shown in FIG. 9, in this non-completely meshed state, parts of the meshing regions of the auxiliary meshing portions 53a, 53b overlap the meshing region of one of the main meshing portion 51 and the auxiliary meshing portion 53 of the other magnetic plates 60 and parts of the meshing regions of the auxiliary meshing portions 54a, 54b overlap the meshing region of one of the main meshing portion 52 and the auxiliary meshing portion 54 of the other magnetic plates 60.

Here, when there is a reduction in the meshing areas where the main meshing portions 51 overlap and the main meshing portions 52 overlap, there is a drop in the detection sensitivity of the sensors 11a, 11b for magnetism, resulting in the risk of a fall in measurement precision. However, with the current measuring apparatus 1, by providing the auxiliary meshing portions 53, 54, even if the respective meshing areas of the main meshing portions 51 and the main meshing portions 52 are reduced, parts (or all) of the meshing regions of the auxiliary meshing portions 53, 54 will overlap the meshing regions of one of the main meshing portions 51, 52 and the auxiliary meshing portions 53, 54 of the other magnetic plates 60, which supplements to some extent the reduction in the respective meshing areas of the main meshing portions 51 and the main meshing portions 52. For this reason, with the current measuring apparatus 1, even in a non-completely meshed state where the meshing regions of the main meshing portions 51 and the meshing regions of the main meshing portions 52 of the magnetic cores 31 do not completely overlap due to a drop in the energizing force of a spring or the like, the drop in the detection sensitivity of the sensors 11a, 11b for magnetism is suppressed. Accordingly, with the current measuring apparatus 1, the measuring precision is sufficiently improved.

Note that in order to verify the effect of the magnetic sensor 2 that uses the magnetic cores 31 equipped with the auxiliary meshing portions 53, 54, the present inventors measured changes in meshing area of the main meshing portions 51, 52 and the auxiliary meshing portions 53, 54 due to different meshing states. For such measurements, the magnetic cores 31a, 31b on which the main meshing portions 51, 52 and the auxiliary meshing portions 53, 54 are formed in the shapes shown in FIG. 7 were fabricated. Next, as shown in FIG. 8, the meshing area of the main meshing portions 51, 52 and the auxiliary meshing portions 53, 54 was measured in a completely meshed state where the main meshing portions 51 of the magnetic cores 31a, 31b overlap to the greatest extent and the main meshing portions 52 overlap to the greatest extent.

Also, as shown in FIG. 9, a non-completely meshed state (hereinafter, this state is referred to as the "0.5° state" and the completely meshed state described above is referred to as the "0° state") where the magnetic core 31b has rotated by 0.5° with respect to the magnetic core 31a about the pivot Pf was produced and the meshing area of the main meshing portions 51, 52 and the auxiliary meshing portions 53, 54 was measured. Also, as shown in FIG. 10, the magnetic core 31b was further rotated by 0.5° (that is, "1°" from the completely meshed state) with respect to the magnetic core 31a about the pivot Pf (hereinafter, this state is referred to as the "1° state") and the meshing area of the main meshing portions 51, 52 and the auxiliary meshing portions 53, 54 was measured.

Figure 11:
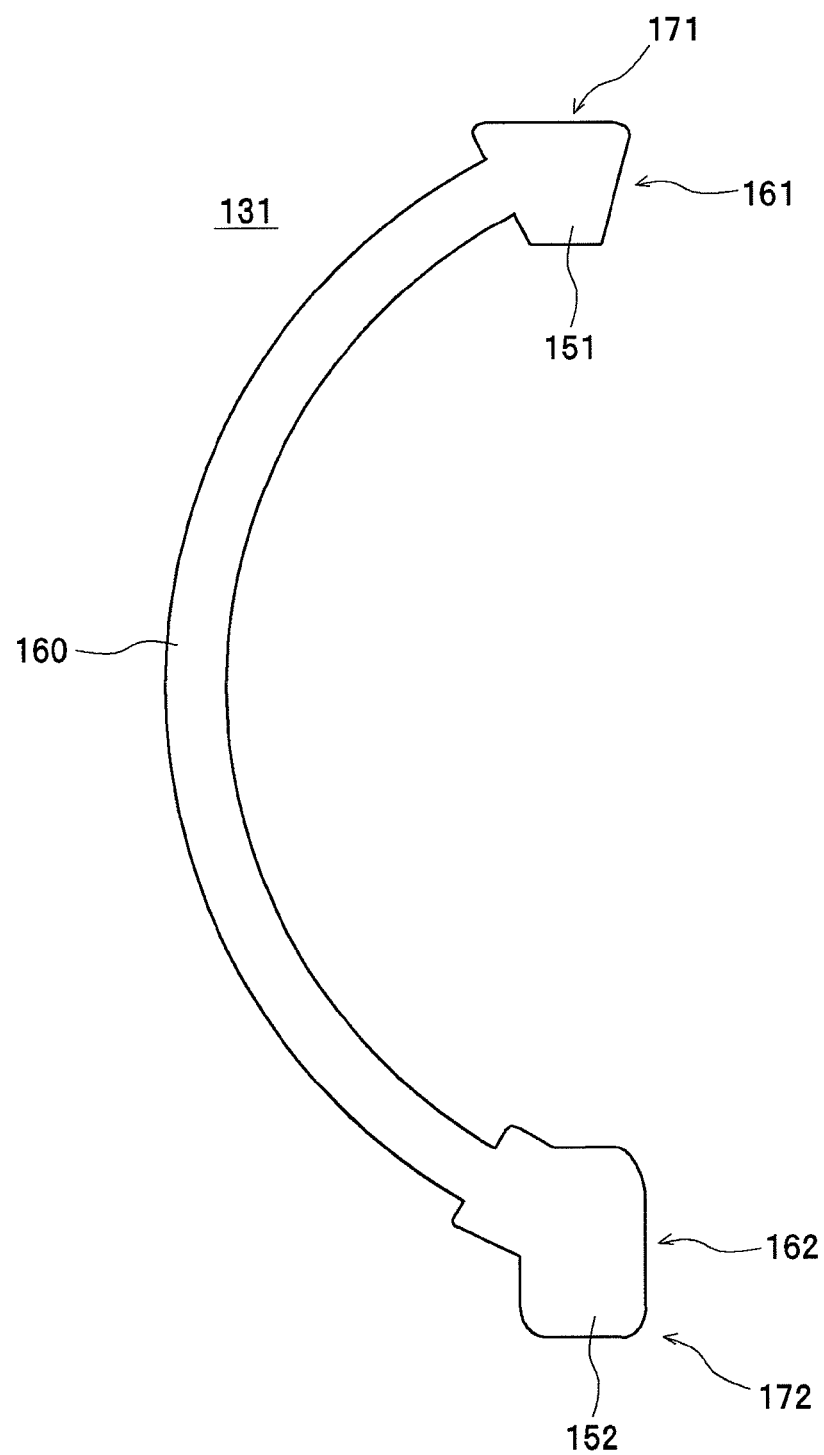
FIG. 11 is a plan view of a magnetic core as a comparative example.

Also, as a comparative example, as shown in FIG. 11, a pair of magnetic cores 131 were fabricated using magnetic plates 160 where neither a main meshing portion 151 of a meshing portion 161 provided at a front end portion 171 nor a main meshing portion 152 of a meshing portion 162 provided at a front end portion 172 are provided with members corresponding to the auxiliary meshing portions 53, 54, and the meshing area of the main meshing portions 151, 152 was measured in the "0° state", "0.5° state", and "1° state" in the same way as described above.

As a result, as shown in FIG. 12, with the magnetic cores 131 that are not equipped with the auxiliary meshing portions 53, 54, if the meshing area M1 of the main meshing portions 151 in the 0° state is set at 100, the meshing area M1 in the 0.5° state was 83.6 (a reduction of 16.4%) and the meshing area M1 in the 1° state was 67.5 (a reduction of 32.5%). Also, with the magnetic cores 131, if the meshing area M2 of the main meshing portions 152 in the 0° state is set at 100, the meshing area M2 in the 0.5° state was 94.3 (a reduction of 5.7%) and the meshing area M2 in the 1° state was 88.5 (a reduction of 11.5%).

On the other hand, with the magnetic cores 31 that are equipped with the auxiliary meshing portions 53, 54, if the meshing area M3 of the main meshing portions 51 and the auxiliary meshing portions 53 in the 0° state is set as 100, the meshing area M3 in the 0.5° state was 84.5 (a reduction of 15.5%) and the meshing area M3 in the 1° state was 68.4 (a reduction of 31.6%). Also, with the magnetic cores 31, if the meshing area M4 of the main meshing portions 52 and the auxiliary meshing portions 54 in the 0° state is set at 100, the meshing area M4 in the 0.5° state was 94.5 (a reduction of 5.5%) and the meshing area M4 in the 1° state was 88.7 (a reduction of 11.3%).

From these results, it is clear that by providing the auxiliary meshing portions 53, 54 on the magnetic cores 31, the reduction in the meshing area of the main meshing portions 51, 52 in the non-completely meshed state is supplemented to an extent, which means that the reduction in the meshing area as a whole is reduced.

In this way, according to the magnetic sensor 2 and the current measuring apparatus 1, by providing the auxiliary meshing portions 53, 54 that protrude at least one of inside and outside the ring-shaped body on at least one of the main meshing portion 51 of the meshing portion 61 provided at the front end portion 71 of the magnetic plates 60 and the main meshing portion 52 of the meshing portion 62 provided at the base end portion 72, even if there is a reduction in the meshing area (the overlapping area) of the main meshing portions 51, 52 in a non-completely meshed state where the meshing portions 61 mesh together and the meshing portions 62 mesh together but without parts of the meshing regions of the main meshing portions 51, 52 overlapping due to a drop in the energizing force of the spring or the like, it is possible to reliably supplement the reduction in the meshing area of the main meshing portions 51, 52 due to part or all of the meshing regions of the auxiliary meshing portions 53, 54 overlapping the meshing region of one of the main meshing portions 51, 52 and the auxiliary meshing portions 53, 54 of the other magnetic plates 60. For this reason, according to the magnetic sensor 2 and the current measuring apparatus 1, even in the non-completely meshed state, it is possible to sufficiently suppress the drop in detection sensitivity of the sensors 11a, 11b for magnetism, and as a result, it is possible to sufficiently improve the measurement precision.

Also, according to the magnetic sensor 2 and the current measuring apparatus 1, by constructing a pair of sensors 11 that both include coil portions 21 formed by winding the lead wire 33 around the magnetic core 31, it is possible to measure a weak alternating current flowing in the detected body using the magnetic sensor 2 and to sufficiently improve the measurement precision when measuring such weak alternating current.

Also, according to the magnetic sensor 2 and the current measuring apparatus 1, by providing the auxiliary meshing portions 53, 54 on the main meshing portions 51, 52 of both the meshing portion 61 provided on the front end portion 71 of the magnetic plates 60 and the meshing portion 62 provided on the base end portion 72, even if the meshing areas of both the main meshing portions 51 and the main meshing portions 52 are reduced in a non-completely meshed state, it is possible to supplement the reductions in both meshing areas. For this reason, according to the magnetic sensor 2 and the current measuring apparatus 1, it is possible to further suppress the drop in the detection sensitivity of the sensors 11a, 11b for magnetism, and as a result it is possible to further improve the measurement sensitivity.

Note that the constructions of the magnetic sensor and the current measuring apparatus are not limited to the constructions described above. For example, although an example has been described where the auxiliary meshing portions 53 that protrude inside the ring-shaped body are provided on the main meshing portions 51, it is also possible to use a construction where auxiliary meshing portions that protrude outside the ring-shaped body are provided on the main meshing portions 51 in place of the auxiliary meshing portions 53 described above or in addition to such auxiliary meshing portions 53. Also, although an example has been described where the auxiliary meshing portions 54 that protrude outside the ring-shaped body are provided on the main meshing portions 52, it is also possible to use a construction where auxiliary meshing portions that protrude inside the ring-shaped body are provided on the main meshing portions 52 in place of the auxiliary meshing portions 54 described above or in addition to such auxiliary meshing portions 54.

Figure 13:
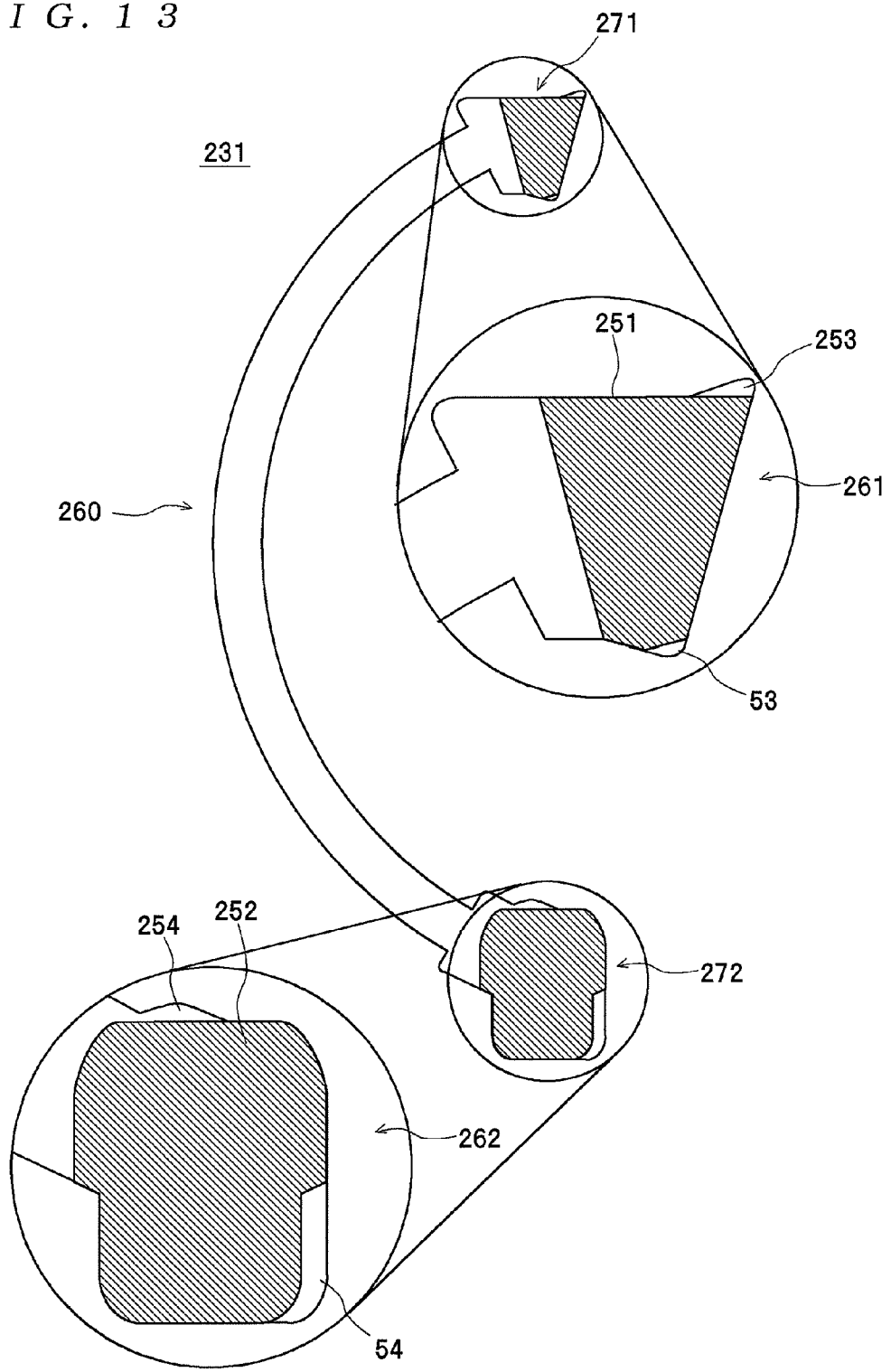
FIG. 13 is a plan view showing the construction of a magnetic core according to another embodiment.

More specifically, it is possible to use magnetic cores 231 shown in FIG. 13. Note that in the description of the magnetic cores 231, construction elements that are the same as the magnetic cores 31 described above have been assigned the same reference numerals and duplicated description thereof is omitted. As shown in FIG. 13, on a main meshing portion 251 of a meshing portion 261 at a front end portion 271 of magnetic plates 260 that construct the magnetic core 231, both the auxiliary meshing portion 53 that protrudes inside a ring-shaped body constructed by the two magnetic cores 231 and the auxiliary meshing portion 253 that protrudes outside the ring-shaped body are provided. Also, on a main meshing portion 252 of a meshing portion 262 at a base end portion 272 of the magnetic plates 260, both the auxiliary meshing portion 54 that protrudes outside the ring-shaped body and the auxiliary meshing portion 254 that protrudes inside the ring-shaped body are provided. According to this construction, by forming the auxiliary meshing portions 53, 253, 54, 254 so as to protrude both inside and outside the ring-shaped body, it is possible in a non-completely meshed state to increase the area (meshing area) that overlaps with the meshing regions of any of the main meshing portions 251, 252 and the auxiliary meshing portions 53, 253, 54, 254 of the other magnetic plates 260. This means that according to this construction, since it is possible to supplement the reduction in the meshing area of the main meshing portions 251, 252 more reliably, it is possible to suppress the drop in detection sensitivity for magnetism more significantly.

Also, as example constructions aside from the magnetic cores 31, 231 described above, it is possible to use the magnetic cores described below with different combinations of the auxiliary meshing portions 53, 253, 54, 254 described above provided on the respective main meshing portions. More specifically, it is possible to use a magnetic core on which the auxiliary meshing portions 53, 253, 254 are provided, a magnetic core on which the auxiliary meshing portions 53, 54, 254 are provided, a magnetic core on which the auxiliary meshing portions 53, 253, 54 are provided, a magnetic core on which the auxiliary meshing portions 253, 54, 254 are provided, a magnetic core on which the auxiliary meshing portions 53, 254 are provided, a magnetic core on which the auxiliary meshing portions 253, 54 are provided, and a magnetic core on which the auxiliary meshing portions 253, 254 are provided.

Also, although an example where auxiliary meshing portions are provided on both the main meshing portions 51, 251 provided on the front end portions 71, 271 of the magnetic plates 60, 260 and the main meshing portions 52, 252 provided on the base end portions 72, 272 has been described, it is also possible to use a construction where auxiliary meshing portions are provided on only one of the main meshing portions 51, 251 and the main meshing portions 52, 252. In this case, as the auxiliary meshing portions, it is possible to use auxiliary meshing portions that protrude only one of inside and outside the ring-shaped body or auxiliary meshing portions that protrude both inside and outside the ring-shaped body.

Figure 14:
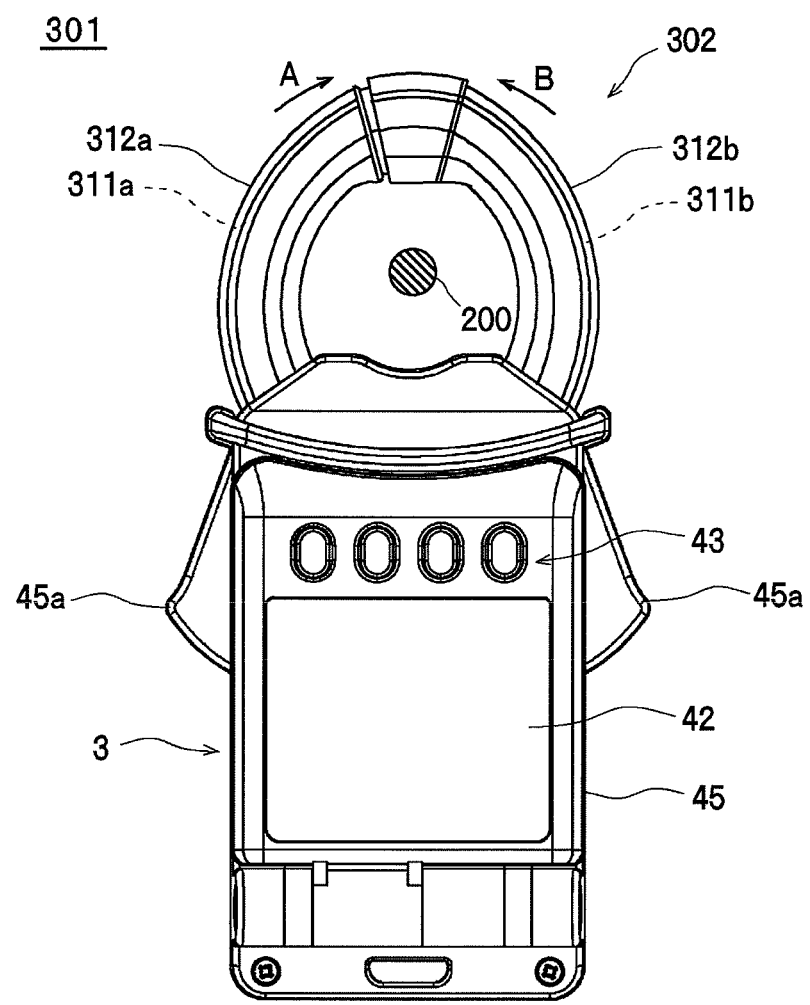
FIG. 14 is a front view of a current measuring apparatus according to the other embodiment.

Next, a current measuring apparatus 301 as another example construction of a current measuring apparatus will be described with reference to the attached drawings. Note that in the description of the current measuring apparatus 301, component elements that are the same as in the current measuring apparatus 1 described above have been assigned the same reference numerals and duplicated description thereof is omitted. As shown in FIG. 14, as one example, the current measuring apparatus 301 is constructed as a clamp-type current measuring apparatus capable of measuring the current I (both direct current and alternating current) flowing in the wire 200 as a detected body in a non-contact manner and includes a magnetic sensor 302 and the main unit 3.

The magnetic sensor 302 is another example of the "magnetic sensor" and as shown in FIG. 14, includes sensors ("sensor units") 311a, 311b (hereinafter referred to as "sensors 311" when no distinction is required) and cases 312a, 312b, and is capable of detecting magnetism produced when the current I (direct current and alternating current) flows in the wire 200 as the detected body.

Figure 15:
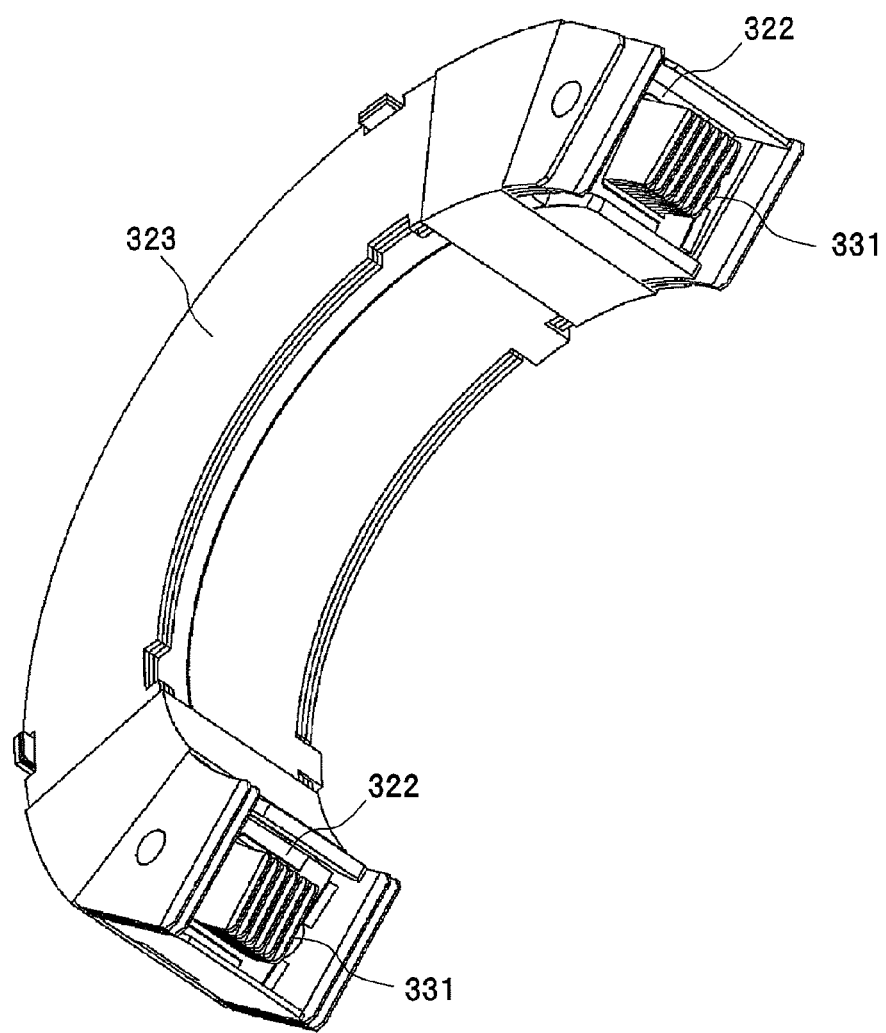
FIG. 15 is a perspective view of a sensor according to the other embodiment.

As shown in FIGS. 15 and 16, sensors 311a, 311b include magnetic cores 331, covers 322, shield portions 323, and magnetism detecting elements 324 (see FIG. 17) and are constructed so as to be substantially arc-shaped (substantially circular arc-shaped) when viewed from above. Note that the magnetic core 331 of the sensor 311a is referred to hereinafter as the "magnetic core 331a" and the magnetic core 331 of the sensor 311b is referred to hereinafter as the "magnetic core 331b". Also, since the sensors 311a, 311b have the same constructions, hereinafter parts that are the same are described for the sensor 311a only and description of the sensor 311b is omitted.

Figure 17:
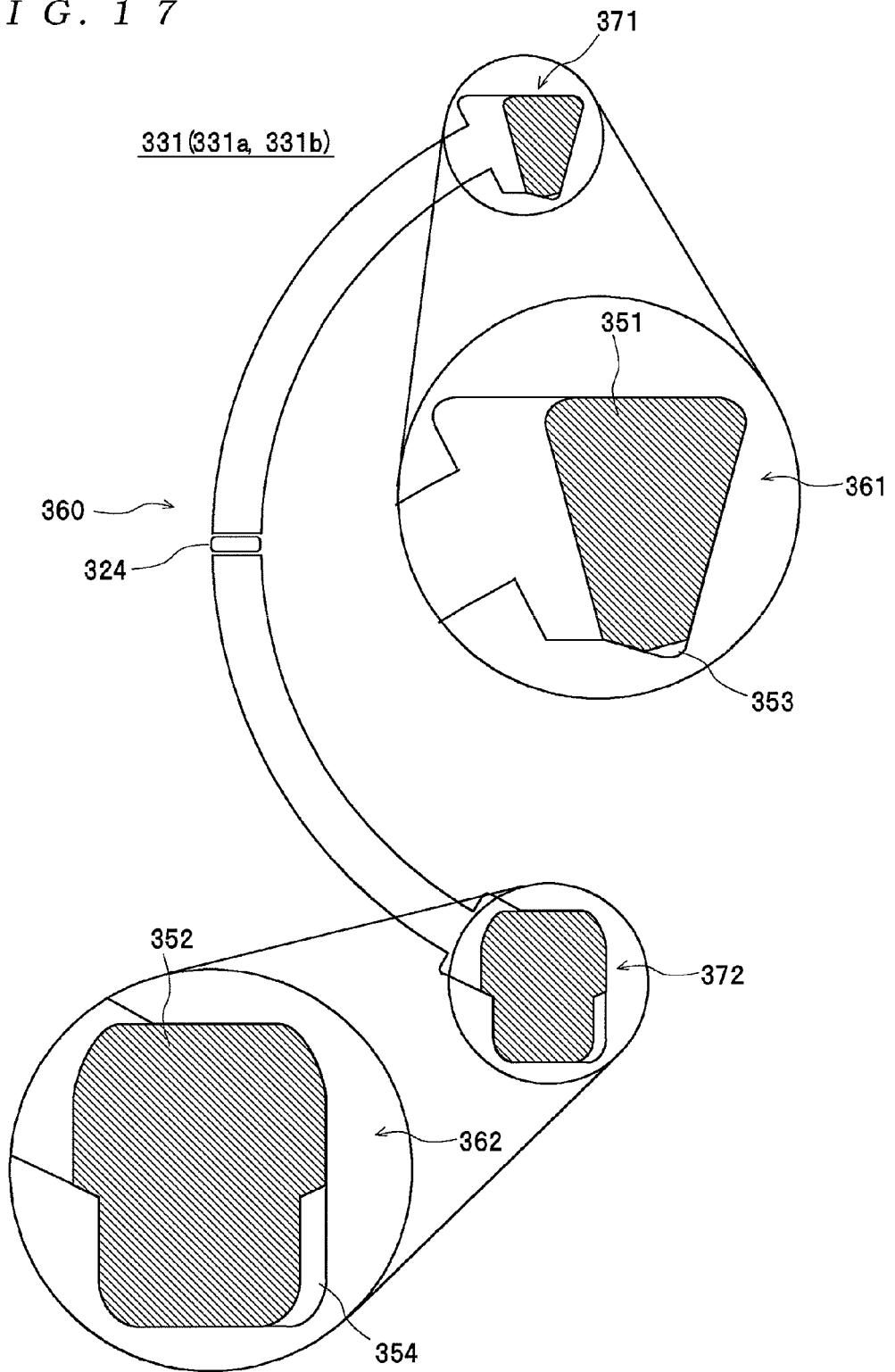
FIG. 17 is a plan view showing the construction of a magnetic core.
Figure 18:
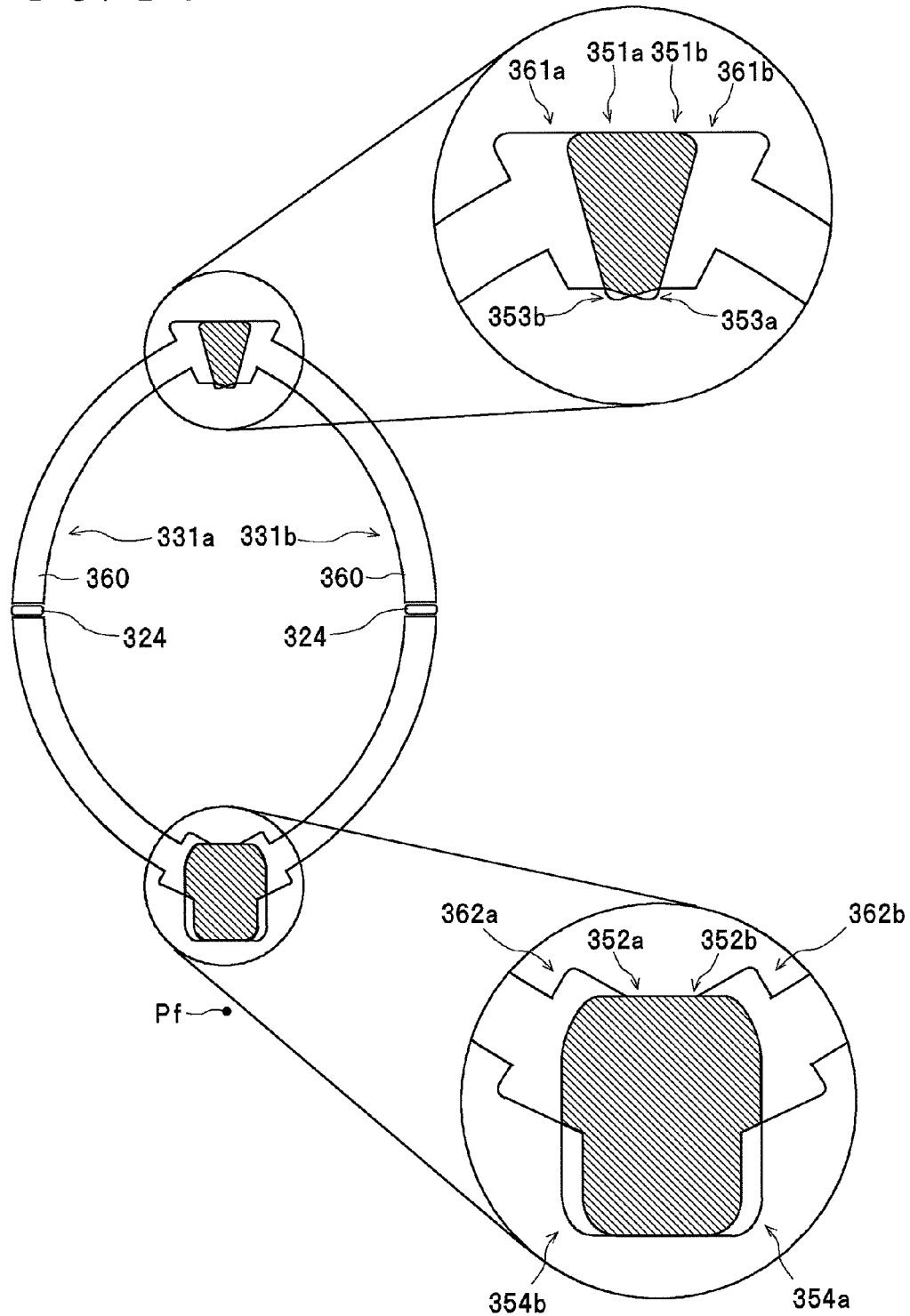
FIG. 18 is a diagram useful in explaining a meshing state of main meshing portions and auxiliary meshing portions.

As shown in FIG. 16, the magnetic core 331 is formed by laminating a plurality of magnetic plates (as one example, metal plates) 360. As shown in FIGS. 17 and 18, the magnetic plates 360 are formed so as to be substantially arc-shaped (substantially circular arc-shaped) when viewed from above. Also, on the magnetic plates 360, meshing portions 361 that have the same shape as the meshing portions 61 of the magnetic plates 60 of the magnetic cores 31 described above are provided on front end portions 371 and meshing portions 362 that have the same shape as the meshing portions 62 of the magnetic plates 60 are provided on base end portions 372. Also, as shown in FIG. 16, by having spacers sandwiched between the magnetic plates 360 in the same way as the magnetic cores 31, the magnetic cores 331 are formed with gaps between the meshing portions 361 and between the meshing portions 362.

Note that the meshing portions 361, 362 of the magnetic core 331a will be referred to hereinafter as the "meshing portions 361a, 362a" and the meshing portions 361, 362 of the magnetic core 331b will be referred to hereinafter as the "meshing portions 361b, 362b".

Also, as shown in FIG. 17, each magnetic core 331 is divided at a center position in the length direction into a front end portion 371 side half (hereinafter referred to as the "front end side half") and a base end portion 372 side half (hereinafter referred to as the "base end side half"), with a gap being formed between the two halves.

With the current measuring apparatus 301, during use, as shown in FIG. 18, the meshing portion 361a of the magnetic core 331a and the meshing portion 361b of the magnetic core 331b mesh together and the meshing portion 362a of the magnetic core 331a and the meshing portion 362b of the magnetic core 331b mesh together to construct a ring-shaped body. The magnetism detecting elements 324 detect magnetic flux induced in the ring-shaped body by the magnetism of the detected body surrounded by the ring-shaped body and output the detection signal Sd.

Also, as shown in FIGS. 17 and 18, a meshing portion 361 is constructed so as to include a main meshing portion 351 that functions in the same way as the main meshing portion 51 of the meshing portion 61 of the magnetic core 31 described above, and a meshing portion 362 is constructed so as to include a main meshing portion 352 that functions in the same way as the main meshing portion 52 of the meshing portion 62 of the magnetic core 31 described above. Note that the main meshing portions 351, 352 of the magnetic core 331a will be referred to hereinafter as the "main meshing portions 351a, 352a" and the main meshing portions 351, 352 of the magnetic core 331b will be referred to hereinafter as the "main meshing portions 351b, 352b".

As shown in FIG. 17, an auxiliary meshing portion 353 that functions in the same way as the auxiliary meshing portion 53 of the meshing portion 61 of the magnetic core 31 described above is provided on the main meshing portion 351 and an auxiliary meshing portion 354 that functions in the same way as the auxiliary meshing portion 53 of the meshing portion 61 of the magnetic core 31 described above is provided on the main meshing portion 352. Note that the auxiliary meshing portions 353, 354 provided on the magnetic core 331a will be referred to hereinafter as the "auxiliary meshing portions 353a, 354a" and the auxiliary meshing portions 353, 354 provided on the magnetic core 331b will be referred to hereinafter as the "auxiliary meshing portions 353b, 354b".

As shown in FIG. 16, the cover 322 is disposed so as to cover a part of the magnetic core 331 aside from the meshing portions 361, 362, and joins the front end side half and the base end side half of the magnetic core 331 that is divided into two so as to form a single arc-shaped magnetic core 331. The shield portion 323 functions in the same way as the shield portion 23 described above and as shown in FIG. 15 is disposed so as to surround the cover 322 disposed on the magnetic core 331.

As one example, each magnetism detecting element 324 is constructed of a Hall element and/or a flux-gate magnetism detecting element, and as shown in FIG. 17 is disposed in the gap between the front end side half and the base end side half of the magnetic core 331. When the wire 200 as the detected body is surrounded by the ring-shaped body constructed by the two magnetic cores 331a, 331b, the magnetism detecting elements 324 detect the magnetic flux induced in the ring-shaped body by the magnetism produced by the current I (direct current and alternating current) flowing in the wire 200 and output the detection signal Sd. Here, with the magnetic sensor 302, although the magnetism detecting elements 324 are disposed on both the magnetic cores 331a, 331b as one example, it is also possible to use a construction where a magnetism detecting element 324 is disposed on only one of the magnetic cores 331a, 331b. It is also possible to use a construction where a plurality of the magnetism detecting elements 324 are disposed on one or both of the magnetic cores 331a, 331b. Note that when such construction is used, the magnetic core 331 is divided into three or more and an equal number of gaps to the number of magnetism detecting elements 324 are provided.

The cases 312a, 312b are constructed so as to be capable of housing the sensors 311a, 311b. In this case, the sensors 311a, 311b are respectively housed in the cases 312a, 312b so that the meshing portions 361 are capable of meshing together (overlapping) and the meshing portions 362 are capable of meshing together (overlapping). As shown in FIG. 14, base end portions of the cases 312a, 312b are attached to the case 45 of the main unit 3 so as to be rotatable about a support shaft (not shown) that is fixed to the pivot Pf (see FIG. 18) of the case 45. Also, the cases 312a, 312b are energized by the energizing force of a spring (not shown) in directions (the directions of the arrows A, B shown in FIG. 14) where the front end portions of the sensors 311a, 311b approach one another.

According to the magnetic sensor 302 and the current measuring apparatus 301, by providing the auxiliary meshing portions 353, 354 that protrude at least one of inside and outside the ring-shaped body on at least one of the main meshing portion 351 of the meshing portion 361 provided at the front end portion 371 of the magnetic plates 360 and the main meshing portion 352 of the meshing portion 362 provided at the base end portion 372, in the same way as the magnetic sensor 2 and the current measuring apparatus 1 described above, even in the non-completely meshed state, it is possible to sufficiently suppress the drop in detection sensitivity of the sensors 311a, 311b for magnetism, and as a result to sufficiently improve the measurement precision.

Also, according to the magnetic sensor 302 and the current measuring apparatus 301, by providing a magnetism detecting element 324 that detects magnetic flux induced in the ring-shaped body constructed by the pair of sensors 311a, 311b on at least one of the pair of sensors 311a, 311b, it is possible to measure both the direct current and alternating current flowing in the detected body in a contactless manner using the magnetic sensor 302, and to sufficiently improve the measurement precision when measuring the currents.

Figure 19:
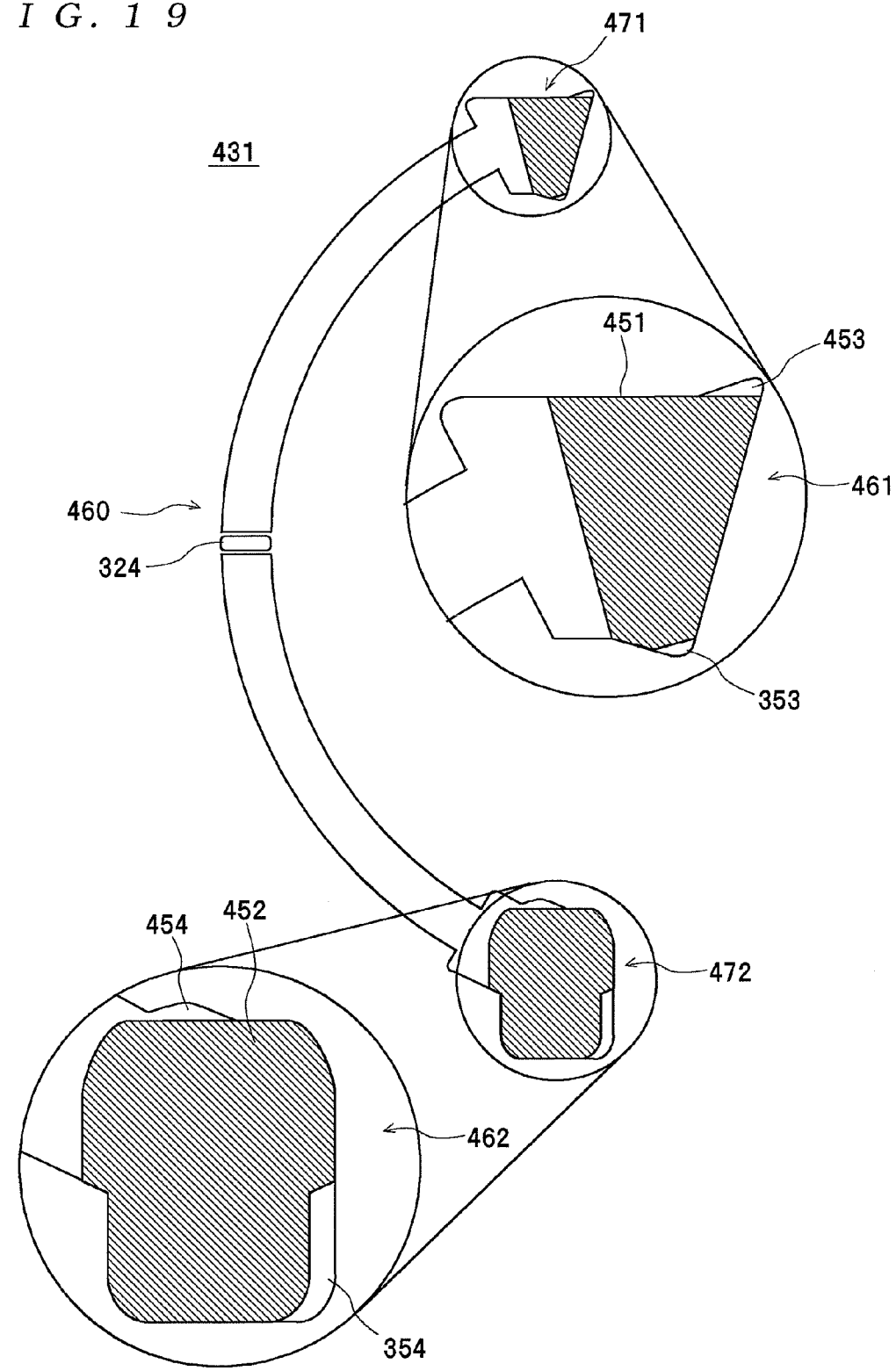
FIG. 19 is a plan view showing the construction of a magnetic core as another embodiment.

Also, it is possible to use magnetic cores 431 shown in FIG. 19. Note that construction elements that are the same as the magnetic cores 331 described above have been assigned the same reference numerals and duplicated description thereof is omitted. As shown in FIG. 19, on a main meshing portion 451 of a meshing portion 461 at a front end portion 471 of magnetic plates 460 that construct the magnetic core 431, both the auxiliary meshing portion 353 that protrudes inside a ring-shaped body constructed by the two magnetic cores 431 and the auxiliary meshing portion 453 that protrudes outside the ring-shaped body are provided. Also, on a main meshing portion 452 of a meshing portion 462 at a base end portion 472 of the magnetic plates 460, both the auxiliary meshing portion 354 that protrudes outside the ring-shaped body and the auxiliary meshing portion 454 that protrudes inside the ring-shaped body are provided. According to this construction, by forming the auxiliary meshing portions 353, 453, 354, 454 so as to protrude both inside and outside the ring-shaped body, it is possible in a non-completely meshed state to increase the area (meshing area) that overlaps with the meshing regions of any of the main meshing portions 451, 452 and the auxiliary meshing portions 353, 453, 354, 454 of the other magnetic plates 460. This means that according to this construction, since it is possible to supplement the reduction in the meshing area of the main meshing portions 451, 452 more reliably, it is possible to suppress the drop in detection sensitivity for magnetism more significantly.

Also, as example constructions aside from the magnetic cores 331, 431 described above, it is possible to use the magnetic cores described below with different combinations of the auxiliary meshing portions 353, 453, 354, 454 described above provided on the respective main meshing portions. More specifically, it is possible to use a magnetic core on which the auxiliary meshing portions 353, 453, 454 are provided, a magnetic core on which the auxiliary meshing portions 353, 354, 454 are provided, a magnetic core on which the auxiliary meshing portions 353, 453, 354 are provided, a magnetic core on which the auxiliary meshing portions 453, 354, 454 are provided, a magnetic core on which the auxiliary meshing portions 353, 454 are provided, a magnetic core on which the auxiliary meshing portions 453, 354 are provided, and a magnetic core on which the auxiliary meshing portions 453, 454 are provided.

Also, although an example where auxiliary meshing portions are provided on both the main meshing portions 351, 451 provided on the front end portions 371, 471 of the magnetic plates 360, 460 and the main meshing portions 352, 452 provided on the base end portions 372, 472 has been described, it is also possible to use a construction where auxiliary meshing portions are provided on only one of the main meshing portions 351, 451 and the main meshing portions 352, 452. In this case, as the auxiliary meshing portions, it is possible to use auxiliary meshing portions that protrude only one of inside and outside the ring-shaped body or auxiliary meshing portions that protrude both inside and outside the ring-shaped body.

What is claimed is:
1. A magnetic sensor, comprising:
a pair of sensors that include substantially arc-shaped magnetic cores comprising lamination of a plurality of magnetic plates which are provided with meshing portions at front end portions and base end portions thereof, the sensors being configured to be rotatable about pivots at base end portion sides thereof, wherein when the meshing portions are meshed together to construct a ring-shaped body, the magnetic sensor detects magnetism of a detected body surrounded by the ring-shaped body, the meshing portions include main meshing portions, having entire meshing regions that overlap one another in a completely meshed state, where respective meshing portions overlap one another completely, wherein auxiliary meshing portions protrude at least one of inside and outside the ring-shaped body and are provided on the main meshing portions of at least one of the meshing portions provided on the front end portions and the base end portions, and in the completely meshed state, the auxiliary meshing portions are configured such that entire meshing regions of the auxiliary meshing portions do not overlap the main meshing portions of the other magnetic plates being meshed and the meshing regions of the auxiliary meshing portions of the other magnetic plates, and in a non-completely meshed state, the meshing portions mesh together without at least a portion of the meshing regions of the main meshing portions overlapping, and at least a portion of the meshing regions of the auxiliary meshing portions overlap meshing regions of one of the main meshing portions of the other magnetic plates and the auxiliary meshing portions of the other magnetic plates.

2. The magnetic sensor according to claim 1, wherein the pair of sensors are each constructed to include a coil portion comprising a winding of a lead wire around the arc-shaped magnetic core of each of the sensors.

3. The magnetic sensor according to claim 2, wherein the auxiliary meshing portions are on the main meshing portions of the meshing portions provided at the front end portions and the base end portions.

4. The magnetic sensor according to claim 3, wherein the auxiliary meshing portions protrude inside and outside the ring-shaped body.

5. A current measuring apparatus, comprising:
the magnetic sensor according to claim 4; and
a measurer measuring a current flowing in the detected body based on a strength of the magnetism detected by the magnetic sensor.

6. A current measuring apparatus, comprising:
the magnetic sensor according to claim 3; and
a measurer measuring a current flowing in the detected body based on a strength of the magnetism detected by the magnetic sensor.

7. The magnetic sensor according to claim 2, wherein the auxiliary meshing portions protrude inside and outside the ring-shaped body.

8. A current measuring apparatus, comprising:
the magnetic sensor according to claim 7; and
a measurer measuring a current flowing in the detected body based on a strength of the magnetism detected by the magnetic sensor.

9. A current measuring apparatus, comprising:
the magnetic sensor according to claim 2; and
a measurer measuring a current flowing in the detected body based on a strength of the magnetism detected by the magnetic sensor.

10. The magnetic sensor according to claim 1, wherein at least one of the pair of sensors includes a magnetism detecting element that detects magnetic flux induced in the ring-shaped body.

11. The magnetic sensor according to claim 10, wherein the auxiliary meshing portions are on the main meshing portions of the meshing portions provided at the front end portions and the base end portions.

12. The magnetic sensor according to claim 11, wherein the auxiliary meshing portions protrude inside and outside the ring-shaped body.

13. A current measuring apparatus, comprising:
the magnetic sensor according to claim 11; and
a measurer measuring a current flowing in the detected body based on a strength of the magnetism detected by the magnetic sensor.

14. A current measuring apparatus, comprising:
the magnetic sensor according to claim 12; and
a measurer measuring a current flowing in the detected body based on a strength of the magnetism detected by the magnetic sensor.

15. The magnetic sensor according to claim 10, wherein the auxiliary meshing portions protrude inside and outside the ring-shaped body.

16. A current measuring apparatus, comprising:
the magnetic sensor according to claim 15; and
a measurer measuring a current flowing in the detected body based on a strength of the magnetism detected by the magnetic sensor.

17. A current measuring apparatus, comprising:
the magnetic sensor according to claim 10; and
a measurer measuring a current flowing in the detected body based on a strength of the magnetism detected by the magnetic sensor.

18. The magnetic sensor according to claim 1, wherein the auxiliary meshing portions are on the main meshing portions of the meshing portions provided at the front end portions and the base end portions.

19. The magnetic sensor according to claim 18, wherein the auxiliary meshing portions protrude inside and outside the ring-shaped body.

20. A current measuring apparatus, comprising:
the magnetic sensor according to claim 19; and
a measurer measuring a current flowing in the detected body based on a strength of the magnetism detected by the magnetic sensor.

21. A current measuring apparatus, comprising:
the magnetic sensor according to claim 18; and
a measurer measuring a current flowing in the detected body based on a strength of the magnetism detected by the magnetic sensor.

22. The magnetic sensor according to claim 1, wherein the auxiliary meshing portions protrude inside and outside the ring-shaped body.

23. A current measuring apparatus, comprising:
the magnetic sensor according to claim 22; and
a measurer measuring a current flowing in the detected body based on a strength of the magnetism detected by the magnetic sensor.

24. A current measuring apparatus, comprising:
the magnetic sensor according to claim 1; and
a measurer measuring a current flowing in the detected body based on a strength of the magnetism detected by the magnetic sensor.

* * * * *